United States Patent
Amadjikpe et al.

(10) Patent No.: US 11,598,842 B2
(45) Date of Patent: Mar. 7, 2023

(54) APPARATUS AND SYSTEM OF SURFACE WAVE MITIGATION FOR MULTIPLE-INPUT-MULTIPLE-OUTPUT (MIMO) RADAR ANTENNA

(71) Applicant: INTEL CORPORATION, Santa Clara, CA (US)

(72) Inventors: Arnaud Lucres Amadjikpe, Beaverton, OR (US); Tae Young Yang, Portland, OR (US); Ofer Markish, Nesher (IL)

(73) Assignee: INTEL CORPORATION, Santa Clara, CA (US)

( * ) Notice: Subject to any disclaimer, the term of this patent is extended or adjusted under 35 U.S.C. 154(b) by 407 days.

(21) Appl. No.: 16/831,924

(22) Filed: Mar. 27, 2020

(65) Prior Publication Data
US 2020/0225314 A1    Jul. 16, 2020

(51) Int. Cl.
| | |
|---|---|
| *H01Q 1/32* | (2006.01) |
| *H01Q 15/00* | (2006.01) |
| *H04B 7/02* | (2018.01) |
| *G01S 7/02* | (2006.01) |
| *G01S 7/03* | (2006.01) |
| *H04B 7/0456* | (2017.01) |
| *H05K 1/02* | (2006.01) |
| *H01Q 1/42* | (2006.01) |

(52) U.S. Cl.
CPC .............. *G01S 7/03* (2013.01); *H04B 7/046* (2013.01); *H05K 1/0234* (2013.01); *H01Q 1/3233* (2013.01); *H01Q 1/42* (2013.01); *H05K 2201/0323* (2013.01)

(58) Field of Classification Search
CPC .......... H01Q 1/32; H01Q 1/3233; H01Q 1/38; H01Q 15/00; H01Q 15/0006; H01Q 15/0026; G01S 7/03; G01S 7/02; G01S 7/023; H05K 1/0234; H05K 2201/0323; H04B 7/02; H04B 7/0413; H04B 7/046
See application file for complete search history.

(56) References Cited

FOREIGN PATENT DOCUMENTS

| DE | 10 2018 215 393 A1 | 3/2020 | |
|---|---|---|---|
| KR | 20200040403 A * | 10/2018 | ............... H01Q 1/38 |
| WO | WO-2021071340 A1 * | 4/2021 | ....... H01L 21/67144 |

OTHER PUBLICATIONS

Extended Search Report for European Patent Application No. 20210239.8, dated Aug. 11, 2021, 17 pages.
Search Report for European Patent Application No. 20210239.8, dated May 11, 2021, 19 pages.
Mitrano C. et al., "CFRP-based broad-band Radar Absorbing Materials", Radar Conference, 2008. RADAR 08, IEEE, Pistacaway, NJ, USA, May 26, 2008, 6 pages, XP031376093.

* cited by examiner

*Primary Examiner* — Blane J Jackson
(74) *Attorney, Agent, or Firm* — Shichrur & Co.

(57) ABSTRACT

For example, an apparatus may include a Printed Circuit Board (PCB); a Multiple-Input-Multiple-Output (MIMO) radar antenna on the PCB, the MIMO radar antenna comprising a plurality of Transmit (Tx) antenna elements configured to transmit Tx radar signals, and a plurality of receive (Rx) antenna elements configured to receive Rx radar signals based on the Tx radar signals; and a surface wave mitigator connected to the PCB, the surface wave mitigator configured to mitigate an impact of surface waves via the PCB on a radiation pattern of the MIMO radar antenna.

24 Claims, 15 Drawing Sheets

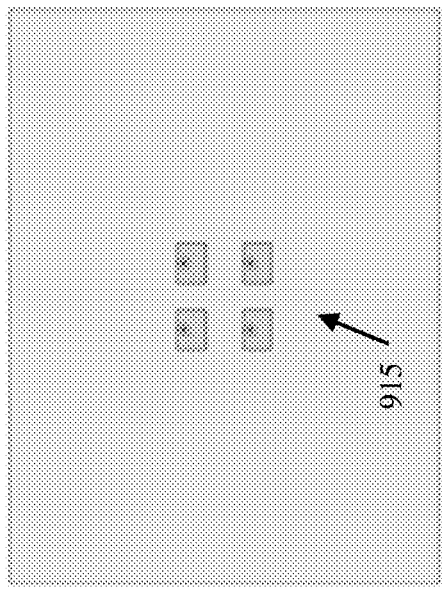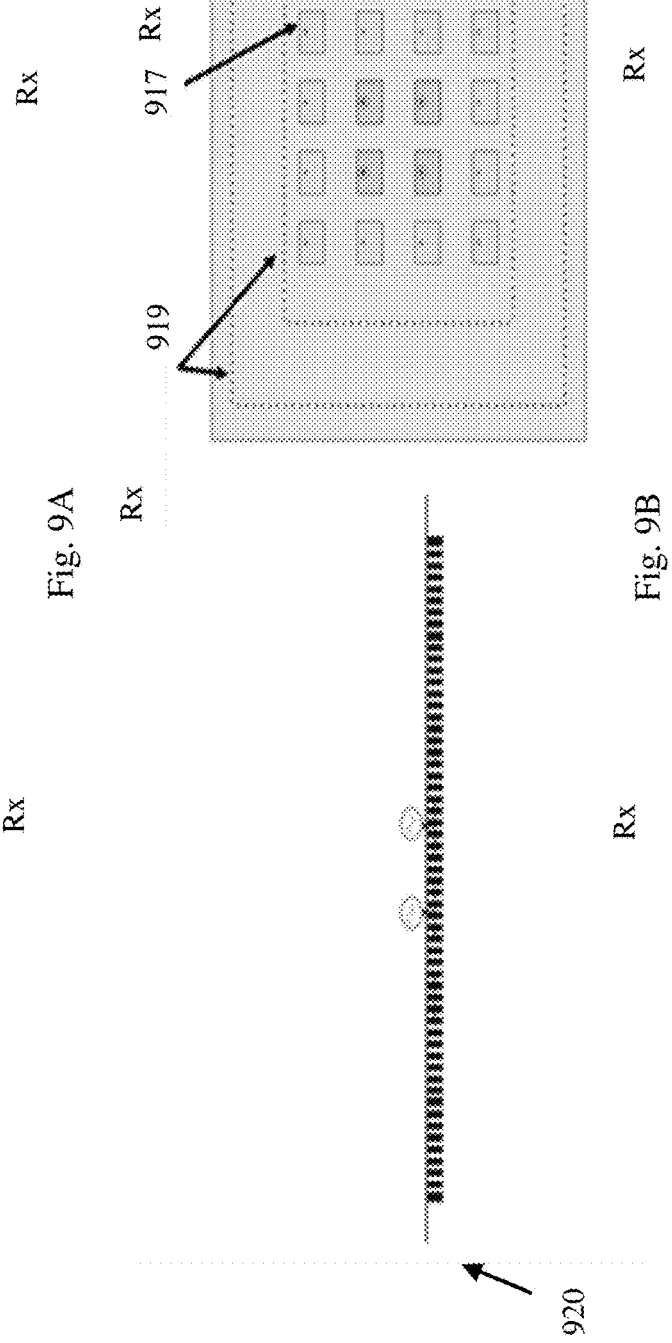
Fig. 9A
Fig. 9B though it may.

APPARATUS AND SYSTEM OF SURFACE WAVE MITIGATION FOR MULTIPLE-INPUT-MULTIPLE-OUTPUT (MIMO) RADAR ANTENNA

TECHNICAL FIELD

Embodiments described herein generally relate to surface wave mitigation for Multiple-Input-Multiple-Output (MIMO) radar antenna.

BACKGROUND

Radar systems may include radar antennas to radiate energy with a pattern, which may be used to detect targets.

There is a need to address a technical problem of surface waves, which may be radiated by the radar antennas and may impact the radiation pattern of the radar antennas.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

FIG. 9A is a schematic illustration of a side view and a top view of an antenna array, and FIG. 9B is a schematic illustration of a side view and a top view of the antenna array of FIG. 9A with a surface wave mitigation scheme utilizing dummy elements and via fences, in accordance with some demonstrative embodiments.

DETAILED DESCRIPTION

Figure 1:
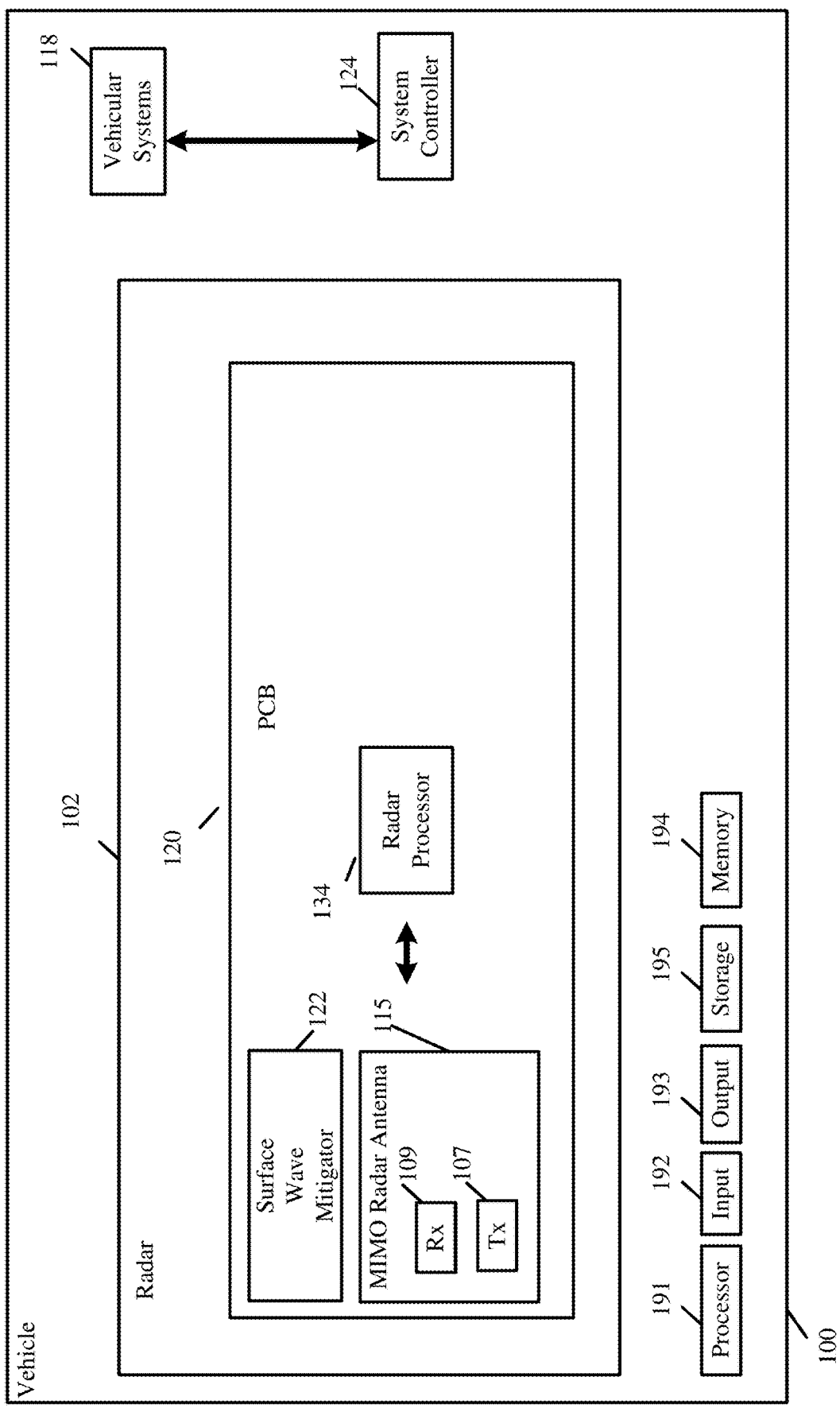
FIG. 1 is a schematic block diagram illustration of a system, in accordance with some demonstrative embodiments.

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one embodiment", "an embodiment", "demonstrative embodiment", "various embodiments" etc., indicate that the embodiment(s) so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

Some embodiments may be used in conjunction with various devices and systems, for example, a radar sensor, a radar device, a radar system, a vehicle, a vehicular system, an autonomous vehicular system, a vehicular communication system, a vehicular device, a sensor device, a User Equipment (UE), a Mobile Device (MD), a wireless station (STA), a sensor device, a non-vehicular device, a mobile or portable device, and the like.

Some embodiments may be used in conjunction with Radio Frequency (RF) systems, radar systems, vehicular radar systems, detection systems, or the like.

Some embodiments may be used in conjunction with one way and/or two-way radio communication systems, cellular radio-telephone communication systems, a mobile phone, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like.

The term "communicating" as used herein with respect to a communication signal includes transmitting the communication signal and/or receiving the communication signal. For example, a communication unit, which is capable of communicating a communication signal, may include a transmitter to transmit the communication signal, and/or a communication receiver to receive the communication signal. The verb communicating may be used to refer to the action of transmitting or the action of receiving. In one example, the phrase "communicating a signal" may refer to the action of transmitting the signal by a first device, and may not necessarily include the action of receiving the signal by a second device. In another example, the phrase "communicating a signal" may refer to the action of receiving the signal by a first device, and may not necessarily include the action of transmitting the signal by a second device.

Some demonstrative embodiments may be used in conjunction with an RF frequency in a frequency band having a starting frequency above 10 Gigahertz (GHz), for example, a frequency band having a starting frequency between 10 GHz and 120 GHz. For example, some demonstrative embodiments may be used in conjunction with an RF frequency having a starting frequency above 30 Ghz, for example, above 45 GHz, e.g., above 60 GHz. For example, some demonstrative embodiments may be used in conjunction with an automotive radar frequency band, e.g., a frequency band between 76 GHz and 81 GHz. However, other embodiments may be implemented utilizing any other suitable frequency bands.

As used herein, the term "circuitry" may refer to, be part of, or include, an Application Specific Integrated Circuit (ASIC), an integrated circuit, an electronic circuit, a processor (shared, dedicated, or group), and/or memory (shared, dedicated, or group), that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

The term "logic" may refer, for example, to computing logic embedded in circuitry of a computing apparatus and/or computing logic stored in a memory of a computing apparatus. For example, the logic may be accessible by a processor of the computing apparatus to execute the computing logic to perform computing functions and/or operations. In one example, logic may be embedded in various types of memory and/or firmware, e.g., silicon blocks of various chips and/or processors. Logic may be included in, and/or implemented as part of, various circuitry, e.g., radio circuitry, receiver circuitry, control circuitry, transmitter circuitry, transceiver circuitry, processor circuitry, and/or the like. In one example, logic may be embedded in volatile memory and/or non-volatile memory, including random access memory, read only memory, programmable memory, magnetic memory, flash memory, persistent memory, and/or the like. Logic may be executed by one or more processors using memory, e.g., registers, buffers, stacks, and the like, coupled to the one or more processors, e.g., as necessary to execute the logic.

The term "antenna", as used herein, may include any suitable configuration, structure and/or arrangement of one or more antenna elements, components, units, assemblies and/or arrays. In some embodiments, the antenna may implement transmit and receive functionalities using separate transmit and receive antenna elements. In some embodiments, the antenna may implement transmit and receive functionalities using common and/or integrated transmit/receive elements. The antenna may include, for example, a phased array antenna, a single element antenna, a set of switched beam antennas, and/or the like.

Some demonstrative embodiments are described herein with respect to RF radar signals. However, other embodiments may be implemented with respect to any other wireless signals, wireless communication signals, communication scheme, network, standard and/or protocol.

Reference is now made to FIG. 1, which schematically illustrates a block diagram of a system including a vehicle 100, in accordance with some demonstrative embodiments.

In some demonstrative embodiments, vehicle 100 may include a car, a truck, a motorcycle, a bus, or any other vehicle.

In some demonstrative embodiments, vehicle 100 may be configured to support and/or implement a vehicular system, for example, to be implemented and/or to be mounted in vehicle 100.

In some demonstrative embodiments, the vehicular system may include, for example, an autonomous vehicle system, an automated driving system, a driver assistance and/or support system, and/or the like.

In some demonstrative embodiments, vehicle 100 may include a radar 102. For example, radar 102 may include a radar detecting device, a radar sensing device, a radar sensor, or the like, e.g., as described below.

In some demonstrative embodiments, radar 102 may include a Multiple Input Multiple Output (MIMO) radar, e.g., as described below.

In some demonstrative embodiments, radar 102 may be configured to detect, and/or sense, one or more objects, which may be located in a vicinity, e.g., a far vicinity and/or a near vicinity, of the vehicle 100, and to provide one or more parameters, attributes and/or information with respect to the objects.

In some demonstrative embodiments, the objects may include other vehicles, pedestrians, traffic signs, traffic lights, roads and/or the like.

In some demonstrative embodiments, the one or parameters, attributes and/or information with respect to the object may include a range of the objects from the vehicle 100, a location of the object with respect to the vehicle 100, a relative speed of the object, and/or the like.

In some demonstrative embodiments, vehicle 100 may include a system controller 124 configured to control one or more functionalities, components, devices, systems and/or elements of vehicle 100.

In some demonstrative embodiments, system controller 124 may be configured to control one or more vehicular systems 118 of vehicle 100, e.g., as described below.

In some demonstrative embodiments, vehicular systems 118 may include, for example, a steering system, a braking system, a driving system, and/or any other system of the vehicle 100.

In some demonstrative embodiments, system controller 124 may be configured to control radar 102, and/or to process one or parameters, attributes and/or information from radar 102.

In some demonstrative embodiments, system controller 124 may be configured, for example, to control the vehicular systems 118 of the vehicle, for example, based on radar information from radar 102 and/or one or more other sensors of the vehicle, e.g., Light Detection and Ranging (LIDAR) sensors, camera sensors, and/or the like.

In one example, system controller 124 may control the steering system, the braking system, and/or any other vehicular systems 118 of vehicle 100, for example, based on the information from radar 102, e.g., based on one or more objects detected by radar 102.

In other embodiments, system controller 124 may be configured, for example, to control any other functionalities of vehicle 100.

In some demonstrative embodiments, vehicle 100 may include, for example, one or more of a processor 191, an input unit 192, an output unit 193, a memory unit 194, and/or a storage unit 195. Vehicle 100 may optionally include other suitable hardware components and/or software components. In some demonstrative embodiments, some or all of the components of one or more of vehicle 100 may be enclosed in a common housing or packaging, and may be interconnected or operably associated using one or more wired or wireless links. In other embodiments, components of one or more of vehicle 100 may be distributed among multiple or separate devices.

In some demonstrative embodiments, processor 191 may include, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. Processor 191 executes instructions, for example, of an Operating System (OS), e.g., a vehicular operating system, of vehicle 100 and/or of one or more suitable applications.

In some demonstrative embodiments, input unit 192 may include, for example, a touch-screen, a touch-pad, a trackball, a stylus, a microphone, or other suitable pointing device or input device. Output unit 193 includes, for example, a monitor, a screen, a touch-screen, a flat panel display, a Light Emitting Diode (LED) display unit, a Liquid Crystal Display (LCD) display unit, one or more audio speakers or earphones, or other suitable output devices.

In some demonstrative embodiments, memory unit 194 includes, for example, a Random Access Memory (RAM), a Read Only Memory (ROM), a Dynamic RAM (DRAM), a Synchronous DRAM (SD-RAM), a flash memory, a volatile memory, a non-volatile memory, a cache memory, a buffer, a short term memory unit, a long term memory unit, or other suitable memory units. Storage unit 195, for example, a hard disk drive, a Solid State Drive (SSD), a floppy disk drive, a Compact Disk (CD) drive, a CD-ROM drive, a DVD drive, or other suitable removable or non-removable storage units. Memory unit 194 and/or storage unit 195, for example, may store data processed by vehicle 100.

In some demonstrative embodiments, radar 102 may include, or may be implemented as part of, a Printed Circuit Board (PCB) 120, e.g., as described below.

In some demonstrative embodiments, PCB 120 may be configured to mechanically supports and/or electrically connect electrical or electronic components and/or elements of radar 102, for example, using conductive tracks, e.g., as described below.

In some demonstrative embodiments, radar 102 may include a radar processor 134 configured to process radar information of radar 102 and/or to control one or more operations of radar 102, e.g., as described below.

In some demonstrative embodiments, radar processor 134 may include, or may be implemented, partially or entirely, by circuitry and/or logic, e.g., one or more processors including circuitry and/or logic, memory circuitry and/or logic. Additionally or alternatively, one or more functionalities of radar processor 134 may be implemented by logic, which may be executed by a machine and/or one or more processors, e.g., as described below.

In one example, radar processor 134 may include at least one memory, e.g., coupled to the one or more processors. The at least one memory may be configured, for example, to store, e.g., at least temporarily, at least some of the information processed by the one or more processors and/or circuitry. Additionally or alternatively, the at least one memory may be configured to store logic to be utilized by the processors and/or circuitry.

In other embodiments, radar processor 134 may be implemented by one or more additional or alternative elements of vehicle 100.

In some demonstrative embodiments, at least part of the functionality of radar processor 134 may be implemented as part of system controller 124.

In other embodiments, the functionality of radar processor 134 may be implemented as part of any other element of radar 102 and/or vehicle 100.

In some demonstrative embodiments, radar processor 134 may be implemented, partially or entirely, on PCB 120, e.g., as described below.

In other embodiments, radar processor 134 may be implemented, as a separate part of, or as part of any other element of radar 102.

In some demonstrative embodiments, radar 102 may include a Multiple-Input-Multiple-Output (MIMO) radar antenna 115 on the PCB 120, e.g., as described below.

In some demonstrative embodiments, MIMO radar antenna 115 may be disposed on, placed on, attached on, connected on, positioned on, and/or formed on, PCB 120, e.g., directly on PCB 120.

In other embodiments, MIMO radar antenna 115 may be implemented as part of any other element, which may be disposed on, placed on, attached on, connected on, positioned on, and/or formed on, PCB 120.

In some demonstrative embodiments, for example, MIMO radar antenna 115 may be implemented as part of a package, e.g., as an Antenna-in-Package (AiP), or as part of a surface mount antenna module. In one example, the package including the MIMO radar antenna 115 may be on the PCB 120, e.g., attached to the PCB 120, for example, via a ball grid array, or in any other manner. In some demonstrative embodiments, MIMO radar antenna 115 may include a plurality of Transmit (Tx) antenna elements 107 configured to transmit Tx radar signals, e.g., as described below.

In some demonstrative embodiments, MIMO radar antenna 115 may include a plurality of Receive (Rx) antenna elements 109 configured to receive Rx radar signals, for example, based on the Tx radar signals, e.g., as described below.

In some demonstrative embodiments, radar processor 134 may be configured to detect one or more targets, for example, based on the Rx radar signals, e.g., as described below.

In one example, antenna elements 107 and/or 109 may include or may be part of any type of antennas suitable for transmitting and/or receiving radar signals. For example, antenna elements 107 and/or 109 may be implemented as part of any suitable configuration, structure and/or arrangement of one or more antenna elements, components, units, assemblies and/or arrays. For example, antenna elements 107 and/or 109 may be implemented as part of a phased array antenna, a multiple element antenna, a set of switched beam antennas, and/or the like. In some embodiments, antenna elements 107 and/or 109 may be implemented to support transmit and receive functionalities using separate transmit and receive antenna elements. In some embodiments, antenna elements 107 and/or 109 may be implemented to support transmit and receive functionalities using common and/or integrated transmit/receive elements.

In some demonstrative embodiments, radar 102 may be configured to generate radiation patterns to simultaneously "illuminate" an entire field-of-view of radar 102, for example, to estimate a direction-of-arrival of targets.

In one example, a radiation pattern of a transmit-receive antenna pair, e.g., of antenna elements 107 and 109, may maintain a half power beamwidth, which may match a field-of-view of the radar 102. For example, automotive corner radars may include azimuth requirements for a field-of-view between 120 degrees and 140 degrees.

In some demonstrative embodiments, there may be a need to solve one or more technical problems, for example, to achieve a wide beamwidth utilizing a MIMO radar antenna implemented on a PCB, e.g., as described below.

In one example, MIMO radar antenna 115 may excite surface waves into PCB 120, e.g., in addition to radiating the radar signals into free space. For example, the surface waves may be scattered and/or re-radiated into free space, and may be combined with the antenna main lobe, for example, when the surface waves reach a discontinuity, e.g. an edge of PCB 120. According to this example, the surface waves may result in a distorted beam pattern, e.g., having large ripples and/or notches, which may limit an effective antenna beamwidth, and, therefore, may limit a field-of-view of radar 102.

Figure 2:
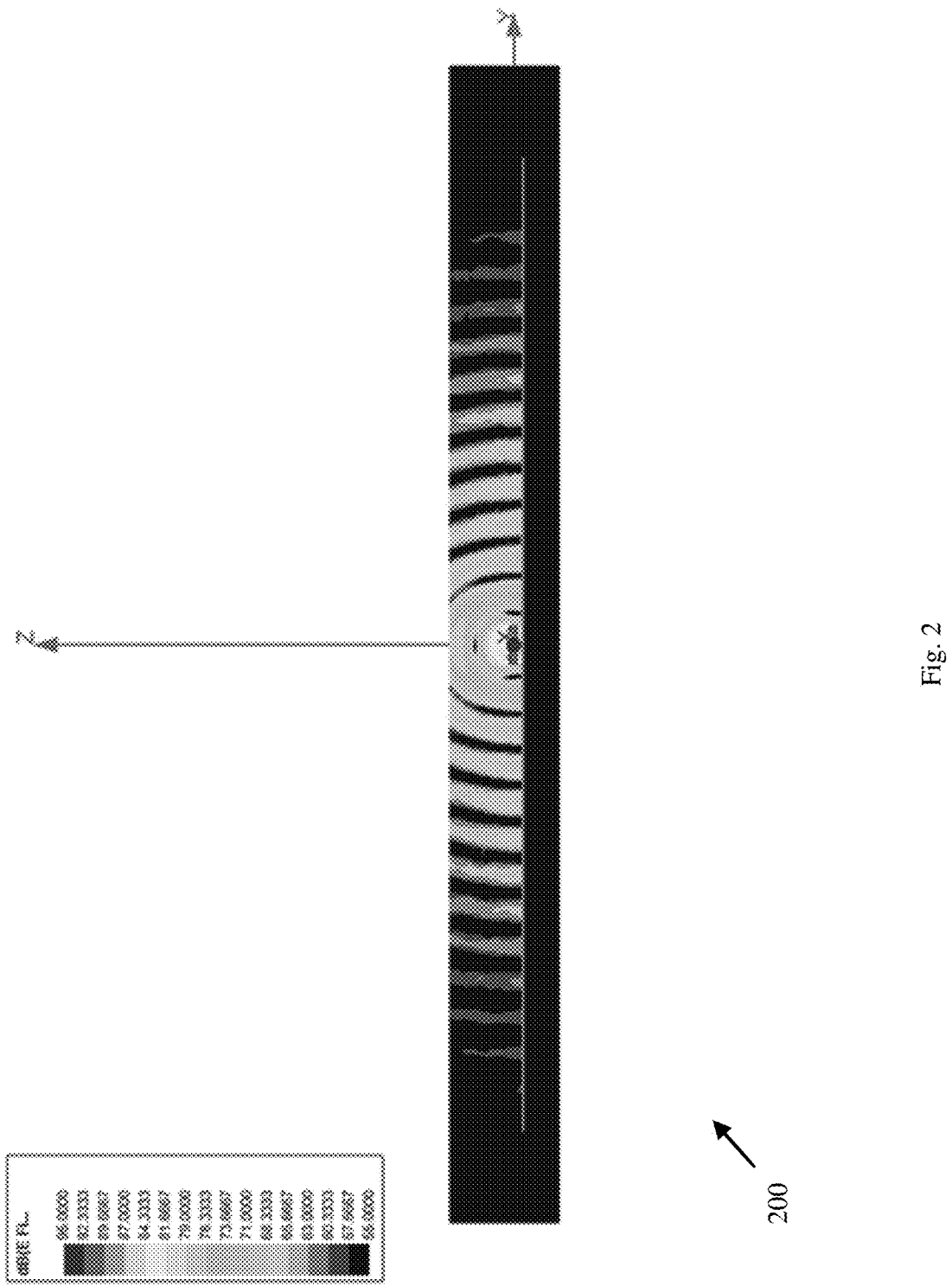
FIG. 2 is a schematic illustration of surface waves guided on a solid ground plane to illustrate a technical problem, which may be addressed in accordance with some demonstrative embodiments.

Reference is made to FIG. 2, which schematically illustrates surface waves guided on a solid ground plane, to illustrate a technical problem, which may be addressed in accordance with some demonstrative embodiments.

As shown in FIG. 2, transmission of signals may result in surface wave guided on a solid ground plane.

Figure 3:
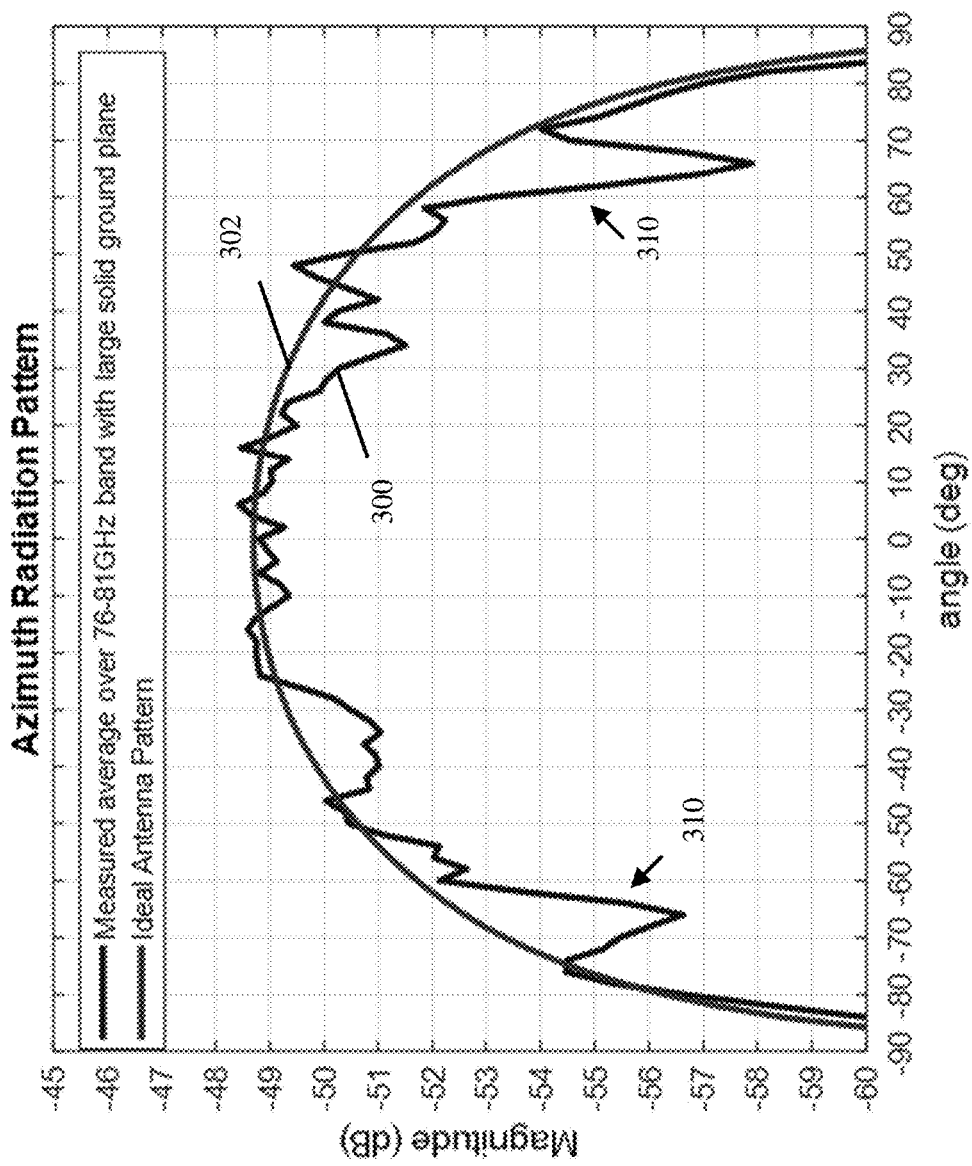
FIG. 3 is a schematic illustration of a graph depicting an impact of surface waves on an azimuth radiation pattern, to illustrate a technical problem, which may be addressed in accordance with some demonstrative embodiments.

Reference is made to FIG. 3, which schematically illustrates a graph depicting an impact of surface waves on an azimuth radiation pattern 300, to illustrate a technical problem, which may be addressed in accordance with some demonstrative embodiments.

As shown in FIG. 3, a measured azimuth radiation pattern 300 of an antenna over a large solid ground plane may include notches 310 near a grazing angle, for example, compared with an ideal cosine element radiation pattern 302. The notches 310 may be caused by an impact of surface waves over the azimuth radiation pattern.

Referring back to FIG. 1, in some demonstrative embodiments, implementing absorbers, which dampen surface currents may have one or more technical inefficiencies, disadvantages and/or problems in one or more use cases and/or scenarios, e.g., as described below.

In one example, an implementation using the absorbers may be effective but may be relatively expensive, since this implementation relies on heavy magnetic loading, e.g., to control an imaginary part of the relative permeability of the absorber material. Therefore, the absorbers may not be widely used, for example, in low-cost commercial applications.

In some demonstrative embodiments, implementing high impedance soft surfaces for surface wave mitigation may have one or more technical inefficiencies, disadvantages and/or problems in one or more use cases and/or scenarios, e.g., as described below.

In one example, the high impedance soft surfaces may include an electromagnetic boundary structure, which may not support guiding of Transverse Magnetic (TM) electromagnetic waves, e.g., since a reflection coefficient at the boundary is nearly +1. For example, use of a soft surface may be justified, e.g., as a particular TM mode ("$TM_0$ mode"), which may be a dominant surface wave mode guided on printed circuit boards. However, the high impedance soft surfaces may distort a main lobe with a large field-of-view. In addition, the high impedance soft surfaces may tend to support a narrower operating bandwidth. For example, the high-impedance soft surface may be highly reflective, which may not provide an optimal solution to mitigate the surface wave phenomenon, e.g., as described below.

Figure 4:
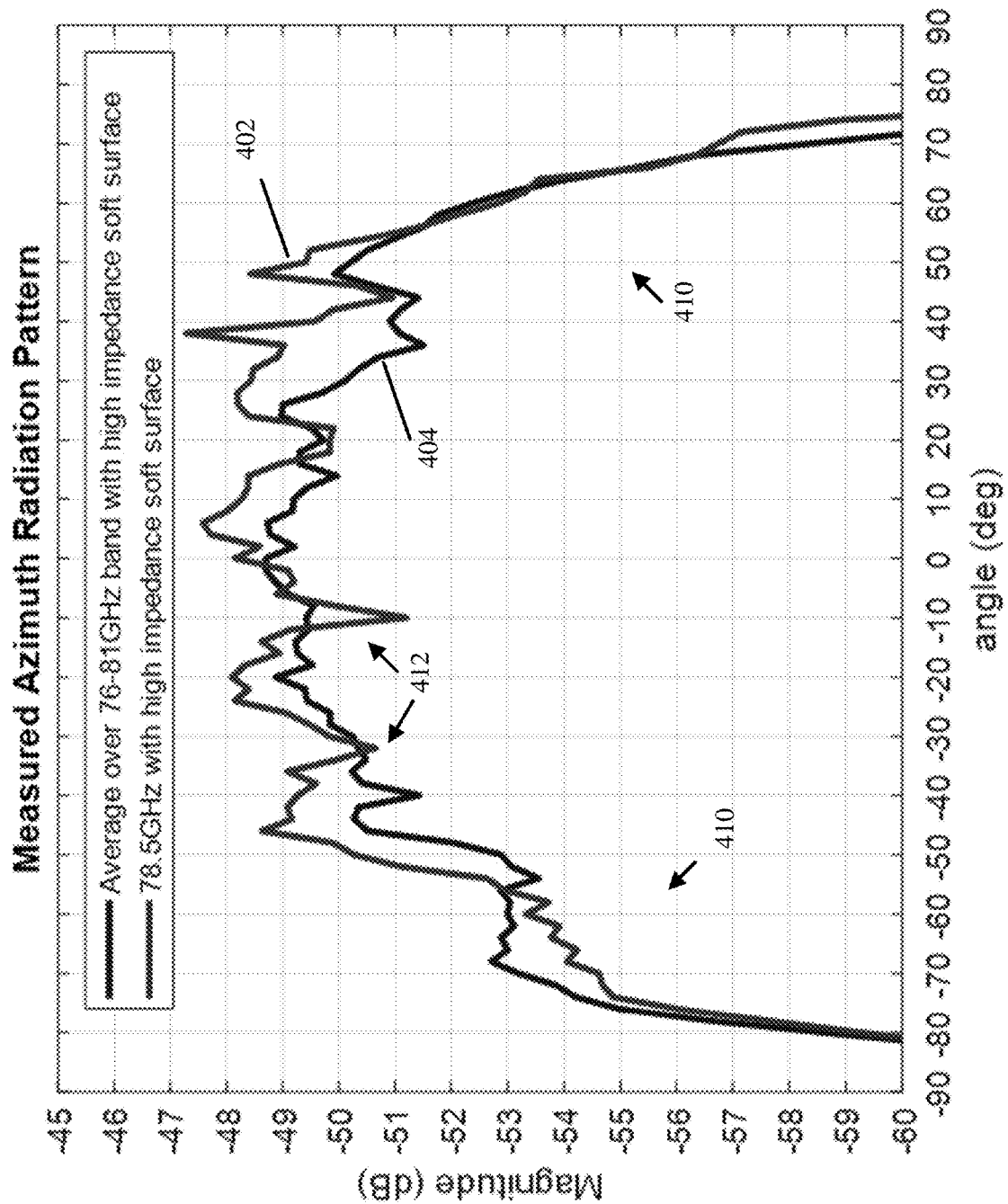
FIG. 4 is a schematic illustration of a graph depicting an impact of surface waves on azimuth radiation pattern, to illustrate a technical problem, which may be addressed in accordance with some demonstrative embodiments.

Reference is made to FIG. 4, which schematically illustrates a graph depicting an impact of surface waves on azimuth radiation patterns, to illustrate a technical problem, which may be addressed in accordance with some demonstrative embodiments.

As shown in FIG. 4, a curve 402 represents a measured azimuth radiation pattern over a frequency band of 78.5 GHz with a high impedance soft surface, and a curve 404 represents a measured average azimuth radiation pattern 404 over a 76-81 GHz frequency band when utilizing the high impedance soft surface.

As shown in FIG. 4, curves 402 and 404 demonstrate that the high impedance soft surface may partially mitigate surface wave effects, for example, by removing nulls near grazing angles 410, e.g., compared to the azimuth radiation pattern 300 (FIG. 3).

However, as shown in FIG. 4, the high impedance soft surface may not mitigate large ripples 412 inside the main lobe pattern near boresight, for example, due to re-radiation into free space.

Referring back to FIG. 1, in some demonstrative embodiments, radar 102 may include a surface wave mitigator 122 connected to the PCB 120, e.g., as described below.

In some demonstrative embodiments, surface wave mitigator 122 may be configured to mitigate an impact of surface waves via (e.g., through) the PCB 120 on a radiation pattern of the MIMO radar antenna 115, e.g., as described below.

In some demonstrative embodiments, surface wave mitigator 122 may be configured to mitigate the impact of the surface waves on a main lobe of the radiation pattern of the MIMO radar antenna 115, e.g., as described below.

In some demonstrative embodiments, surface wave mitigator 122 may be configured to mitigate the impact of the surface waves on a main lobe of an azimuth radiation pattern of the MIMO radar antenna 115, e.g., as described below.

In some demonstrative embodiments, surface wave mitigator 122 may be configured to mitigate the impact of the surface waves in a field of view of at least 110 degrees of the azimuth radiation pattern of the MIMO radar antenna 115, e.g., as described below.

In some demonstrative embodiments, surface wave mitigator 122 may be configured to mitigate the impact of the surface waves in a field of view of at least 120 degrees of the azimuth radiation pattern of the MIMO radar antenna 115, e.g., as described below.

In other embodiments, the surface wave mitigator 122 may be configured to mitigate the impact of the surface waves in any other field of view of the radiation pattern.

In some demonstrative embodiments, surface wave mitigator 122 may be configured to mitigate the impact of the surface waves on a main lobe of an elevation radiation pattern of the MIMO radar antenna 115, e.g., as described below.

In some demonstrative embodiments, surface wave mitigator 122 may be configured to mitigate one or more additional or alternative effects of the surface waves and/or to provide one or more additional and/or alternative technical advantages.

In some demonstrative embodiments, for example, surface wave mitigator 122 may be configured to provide a reduced radar cross section of the MIMO antenna array 115, PCB 120, and/or radar 102 in general.

In some demonstrative embodiments, surface wave mitigator 122 may implement and/or support one or more methods to mitigate surface waves effects, for example, in automotive MIMO radar antennas, e.g., as described below.

In some demonstrative embodiments, surface wave mitigator 122 may implement a carbon-fiber-loaded plastic, for example, with 10 Ohm*cm volume resistivity or any other volume resistivity, for example, as a cost-effective wideband alternative to magnetic surface wave absorbers, e.g., as described below.

In some demonstrative embodiments, the carbon-fiber-loaded plastic may serve, for example, as a spacer between PCB 120 and a radome, for example, to form a mechanically rigid subsystem assembly, e.g., as described below.

In some demonstrative embodiments, surface wave mitigator 122 may implement dummy antenna elements combined with multiple via fences, which may be used as a structure for leveraging and/or reducing surface waves, e.g., as described below.

In some demonstrative embodiments, surface wave mitigator 122 may implement a resistor-loaded soft surface, which may be printed on PCB 120, for example, as a low-profile narrowband surface wave mitigation technique, e.g., as described below.

In some demonstrative embodiments, surface wave mitigator 122 may be configured to extend a radar azimuth field-of-view of MIMO radar antenna 115, for example, by removing notches, e.g., near a grazing angle, and/or by reducing a magnitude of ripples, e.g., inside the main lobe, e.g., as described below.

In some demonstrative embodiments, surface wave mitigator 122 may be implemented to provide a technical solution allowing the use of even a single sensor in each corner of vehicle 100, for example, to provide azimuth coverage of substantially up to 360 degrees. This solution may reduce a cost of radar sensors, e.g., as less sensors may be required for the vehicle, and/or may increase an accuracy of radar sensors to improve target detectability, for example, by providing an increased capability to fuse data between four corner radar units in the overlapping angular sectors.

In some demonstrative embodiments, surface wave mitigator 122 may include a carbon-loaded plastic layer on the PCB 120, e.g., as described below.

In some demonstrative embodiments, the carbon-loaded plastic layer may include carbon fiber loaded plastic, e.g., as described below.

In other embodiments, the carbon-loaded plastic layer may include any other additional or alternative carbon layer including any other additional or alternative type of plastic.

In some demonstrative embodiments, the carbon-loaded plastic layer may be configured as a spacer between the PCB 120 and a radome over the MIMO radar antenna 115, e.g., as described below.

In some demonstrative embodiments, a volume resistivity of the carbon-loaded plastic layer may be between 2 Ohm-centimeter (Ohm*cm) and 40 Ohm*cm, e.g., as described below.

In some demonstrative embodiments, the volume resistivity of the carbon-loaded plastic layer may be between 5 Ohm*cm and 35 Ohm*cm, for example, between 5 Ohm*cm and 17 Ohm*cm, e.g., as described below.

In some demonstrative embodiments, the volume resistivity of the carbon-loaded plastic layer may be between 9 Ohm*cm and 11 Ohm*cm, e.g., as described below.

In other embodiments, the carbon-loaded plastic layer may have any other volume resistivity.

In some demonstrative embodiments, the carbon-loaded plastic layer, e.g., with the volume resistivity of about 10 Ohm*cm, may be very attractive, for example, as the carbon-loaded plastic layer may have a reduced cost and may be injection-molded into any desired shape. In one example, implementing the carbon-loaded plastic layer may not require any assembly steps. For example, the volume resistivity of the carbon-loaded plastic layer may be tuned once, e.g., during manufacturing, and the development cost may be absorbed in High Volume Manufacturing (HVM).

In some demonstrative embodiments, the carbon-loaded plastic layer may be used as a spacer between PCB 120 and a radome to form a mechanically rigid subsystem assembly, e.g., as described below.

In some demonstrative embodiments, a wideband performance of the carbon-loaded plastic layer may make the carbon-loaded plastic layer less sensitive to tolerances, e.g., in subsystem assembly.

Figure 5:
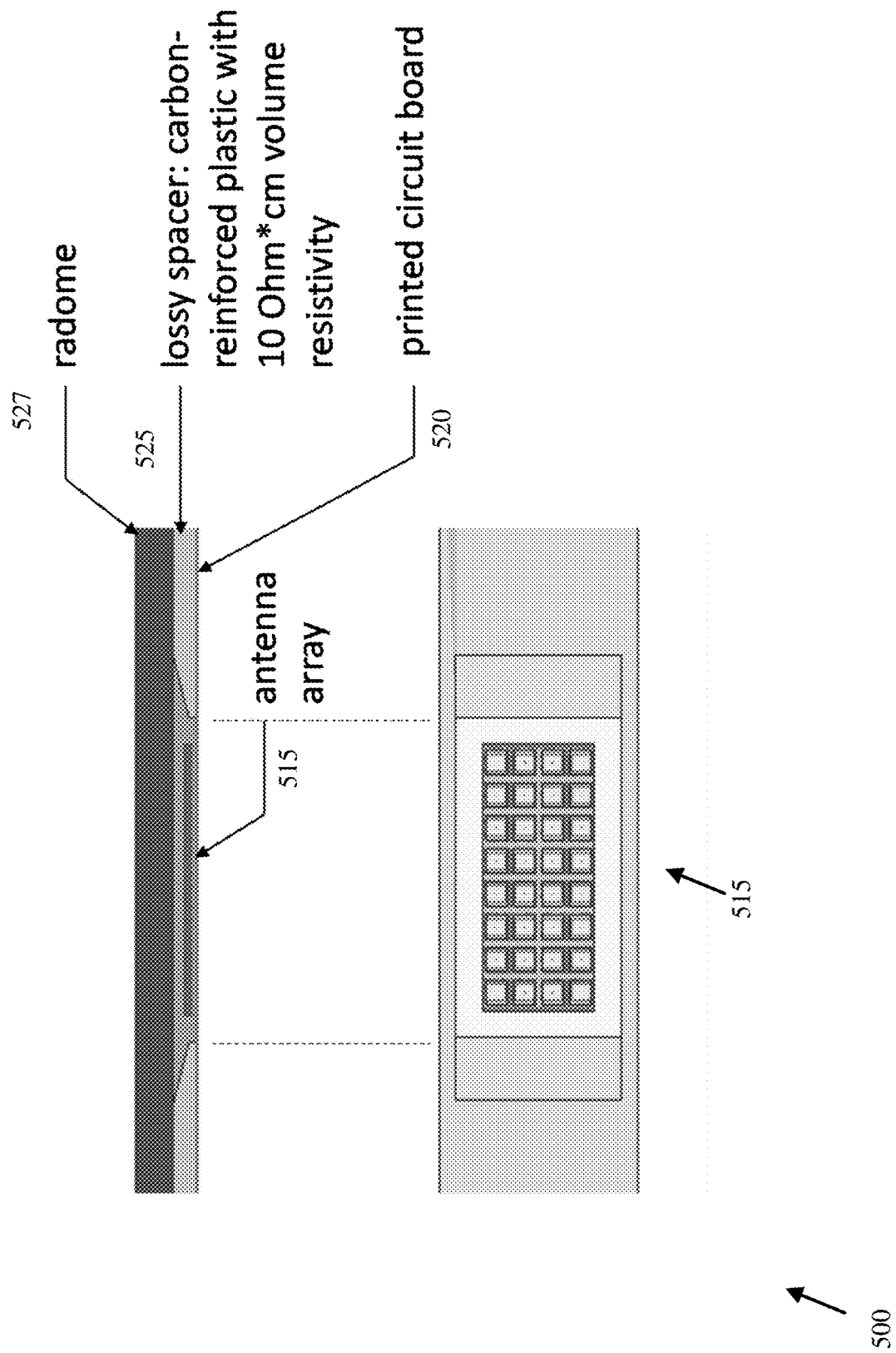
FIG. 5 is a schematic illustration of a surface wave mitigation scheme utilizing a carbon-loaded plastic layer, in accordance with some demonstrative embodiments.

Reference is made to FIG. 5, which schematically illustrates a surface wave mitigation scheme 500 utilizing a carbon-loaded plastic layer 525, in accordance with some demonstrative embodiments. For example, surface wave mitigator 122 (FIG. 1) may include and/or may be implemented by, carbon-loaded plastic layer 525.

In some demonstrative embodiments, as shown in FIG. 5, carbon-loaded plastic layer 525 may be connected to a PCB 520.

In some demonstrative embodiments, as shown in FIG. 5, carbon-loaded plastic layer 525 may be configured as a spacer between the PCB 520 and a radome 527, which may be over a MIMO radar antenna 515.

In some demonstrative embodiments, carbon-loaded plastic layer 525 may be configured, for example, to control a height between the radome 527 and the printed circuit board 520, for example, for optimum antenna radiation performance, e.g., through a material of radome 527.

In some demonstrative embodiments, carbon-loaded plastic layer 525 may be configured, for example, as a rigid interface to maintain flatness of the radome 527, for example, to prevent warping of radome 527. For example, radomes and printed circuit boards may be typically very large in size, e.g., 10 to 20 cm in both x and y dimensions, and, therefore, the plastic redone may warp if not properly supported.

In one example, the spacer may be tapered in any suitable different shape, other than a linear tapering shape.

In some demonstrative embodiments, the carbon-loaded plastic layer 525 may be cost-effective, and may be injection molded into any shape, which may make the carbon-loaded plastic layer an optimized solution to mitigate surface waves currents, for example, in radar system assemblies.

In some demonstrative embodiments, electromagnetic properties of carbon-loaded plastic layer 525 may be configured for surface wave mitigation. For example, carbon-loaded plastic layer 525 may include a rigid plastic material, for example, polybutylene terephthalate (PBT), polyethylene terephthalate (PET), polycarbonate (PC), a compound of those plastics with carbon fiber loading, and/or any other rigid plastic material. For example, a metallic spacer may not be efficient, e.g., as it would behave as a solid ground plane, which may support propagation of TM surface waves.

In some demonstrative embodiments, an amount and/or content of carbon fiber in carbon-loaded plastic layer 525 may be configured, for example, to provide a required volume resistivity of carbon-loaded plastic layer 525, e.g., of about 10 Ohm*cm or any other value, e.g., as described below.

Figure 6:
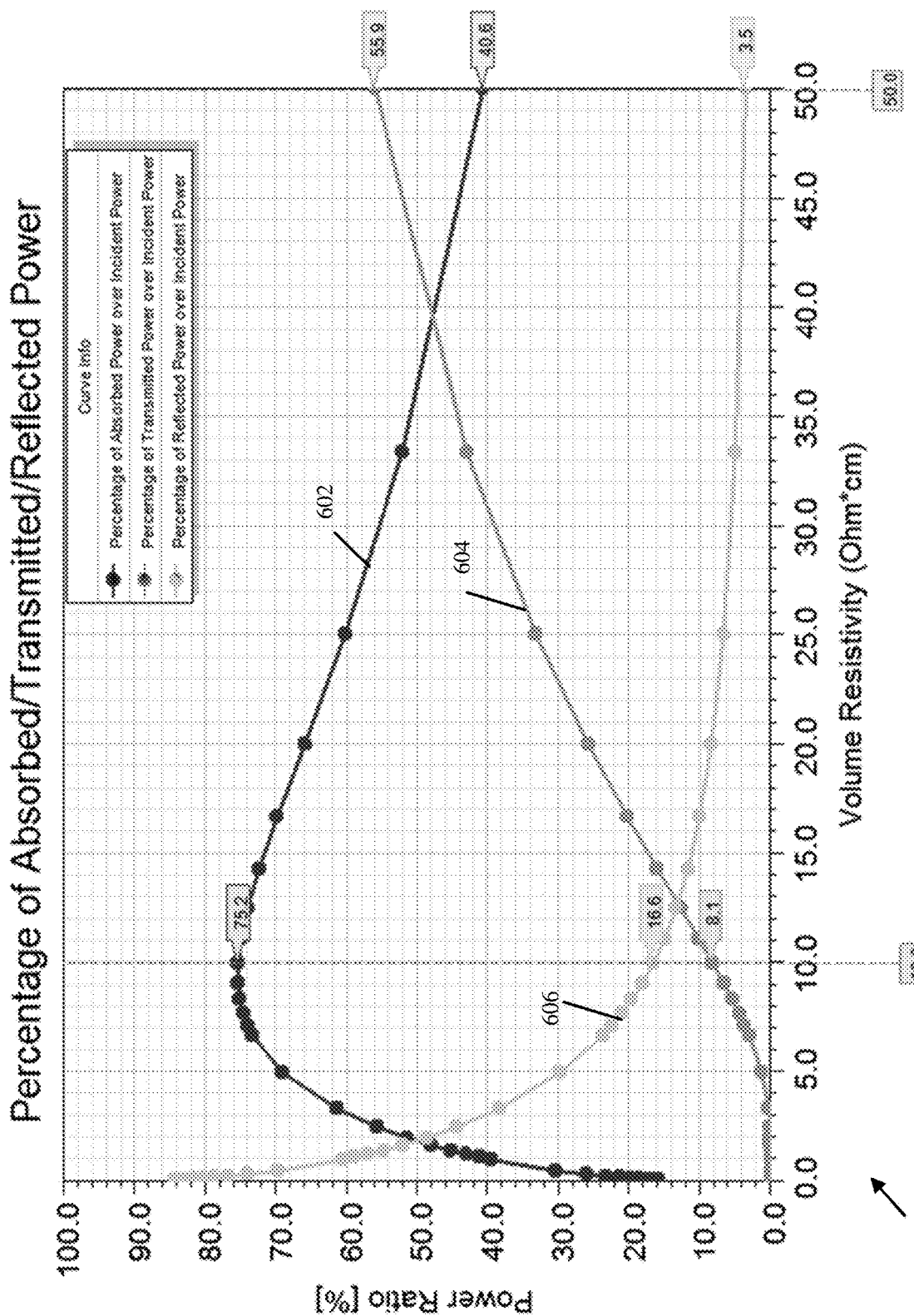
FIG. 6 is a schematic illustration of a graph depicting electronic properties of a carbon-loaded plastic layer versus a volume resistivity of the carbon-loaded plastic layer, in accordance with some demonstrative embodiments.

Reference is made to FIG. 6, which schematically illustrates a graph 600 depicting electronic properties of a carbon-loaded plastic layer versus a volume resistivity of the carbon-loaded plastic layer, in accordance with some demonstrative embodiments.

In one example, the electronic properties of the carbon-loaded plastic layer, e.g., carbon-loaded plastic layer 525 (FIG. 5), may be measured, for example, with respect to a 1.25 mm thick carbon fiber loaded PBT plastic.

For example, as shown in FIG. 6, a curve 602 depicts absorption of power versus a volume resistivity, a curve 604 depicts a transmission of power versus the volume resistivity, and a curve 606 depicts a reflection of power versus the volume resistivity.

In some demonstrative embodiments, as shown in FIG. 6, the carbon-loaded plastic layer may have an increased absorption of surface waves, e.g., about 75% absorption; a reduced reflectivity, e.g., about 10% reflectivity; and a reduced transmission power of the surface waves, e.g., about 15%, for example, when the volume resistivity of the carbon-loaded plastic layer is 10 Ohm*cm, for example, while maintaining a rigid structure of the carbon-loaded plastic layer.

Figure 7:
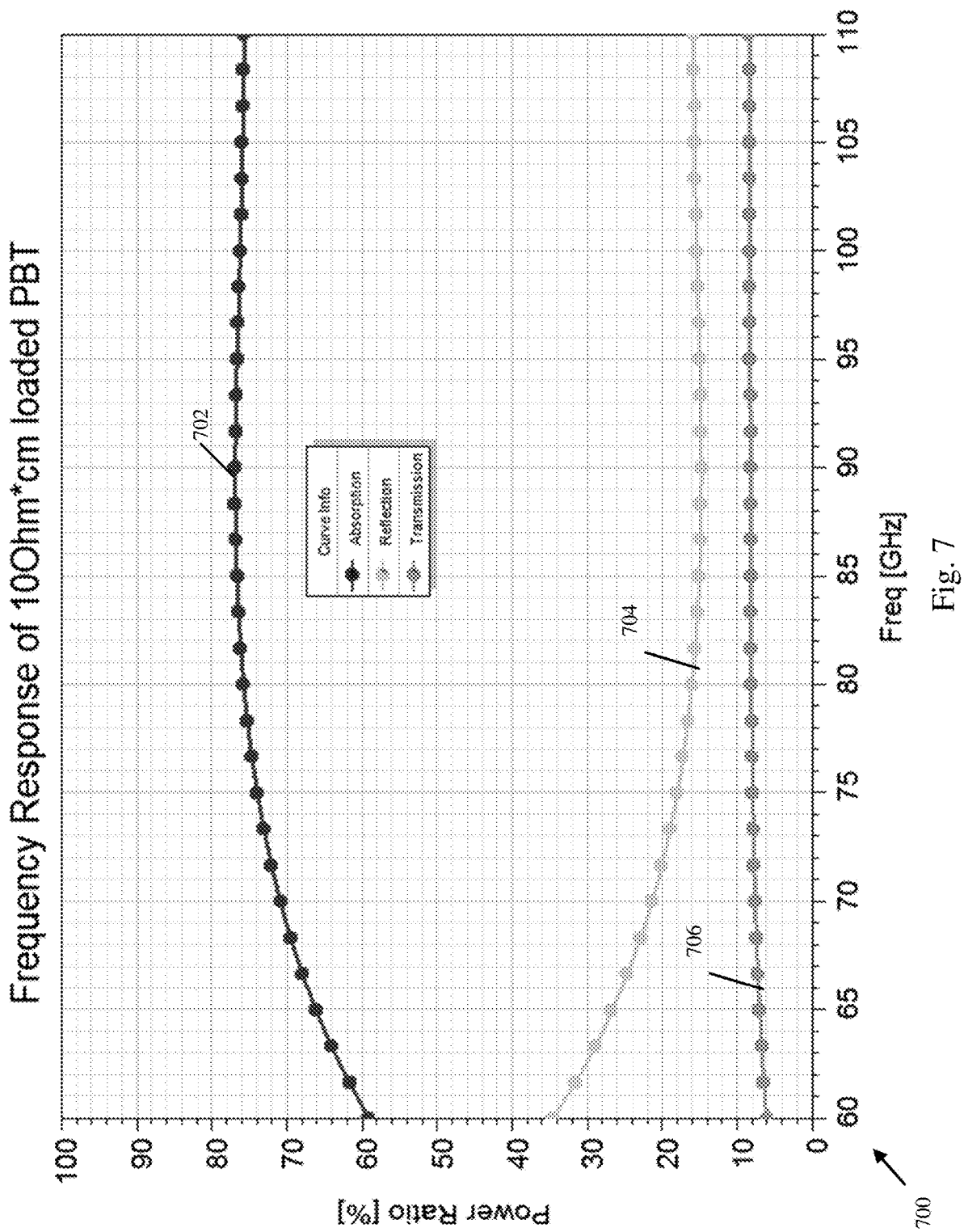
FIG. 7 is a schematic illustration of a graph depicting a frequency response of a carbon-loaded plastic layer, in accordance with some demonstrative embodiments.

Reference is made to FIG. 7, which schematically illustrates a graph 700 depicting a frequency response of a carbon-loaded plastic layer, in accordance with some demonstrative embodiments.

For example, as shown in FIG. 7, a curve 702 depicts absorption of power versus a frequency response, a curve 706 depicts a transmission of power versus the frequency response, and a curve 704 depicts a reflection of power versus the frequency response.

In one example, values of curves 702, 704 and 706 may be measured, for example, using a 1.25 mm-thick carbon-fiber-loaded PBT plastic, which has a volume resistivity of 10 Ohm*cm.

In some demonstrative embodiments, as shown in FIG. 7, the carbon-loaded plastic layer may have an increased absorption of surface waves, a reduced reflectivity, and a reduced transmission power of the surface waves, for example, over a wide frequency range, e.g., between 65-70 GHz and 110 GHz frequency range.

Figure 8:
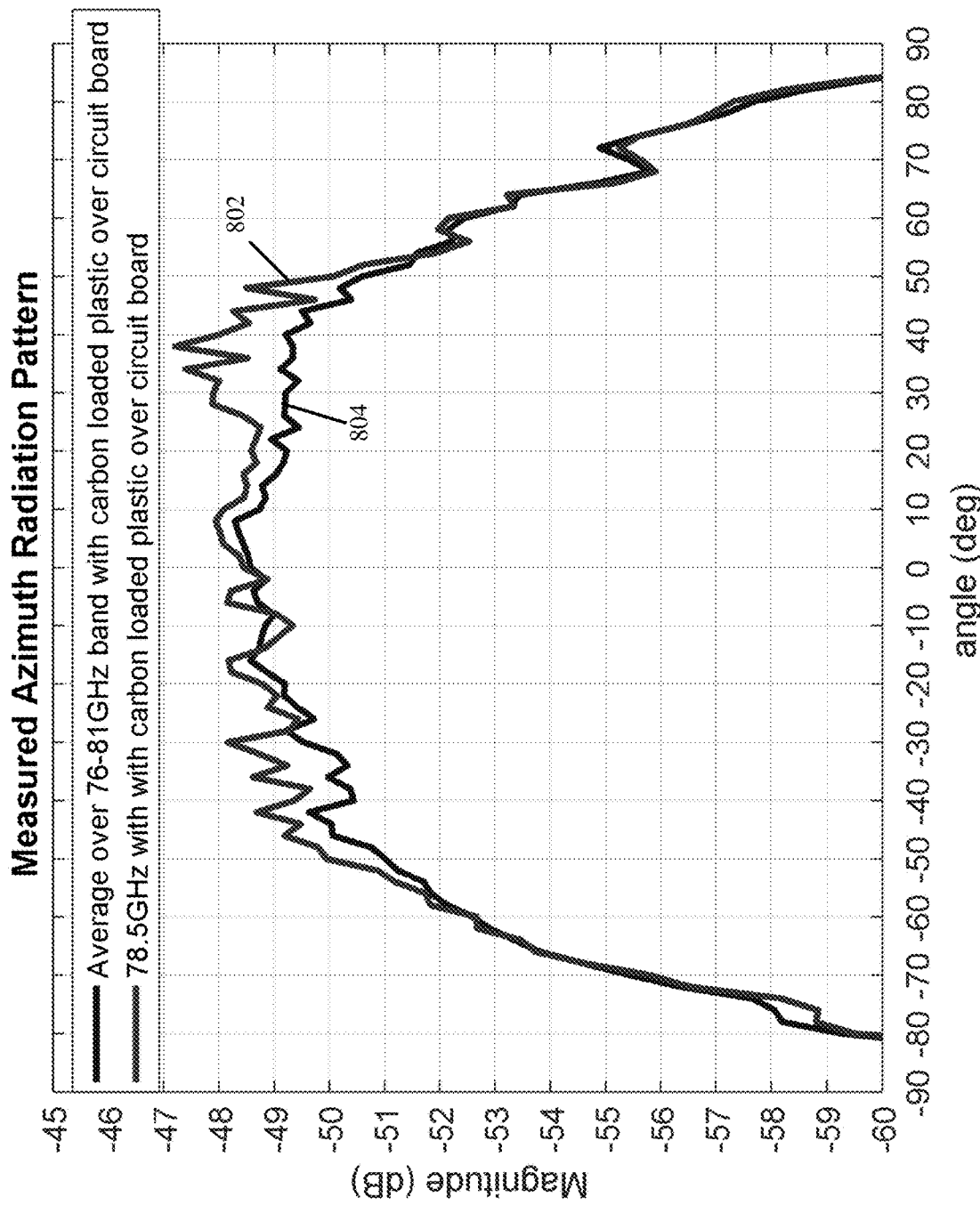
FIG. 8 is a schematic illustration of a graph depicting first and second azimuth radiation patterns, in accordance with some demonstrative embodiments.

Reference is made to FIG. 8, which schematically illustrates a graph depicting a first azimuth radiation pattern 802 and a second azimuth radiation pattern 804, in accordance with some demonstrative embodiments.

In some demonstrative embodiments, azimuth radiation pattern 802 is based on values, which may be measured over 78.5 GHz frequency with a carbon-loaded plastic layer on a PCB, and average azimuth radiation pattern 804 is based on values, which may be measured over a 76-81 GHz frequency band with the carbon-loaded plastic layer on the PCB.

In some demonstrative embodiments, as shown in FIG. 8, the measured azimuth radiation patterns 802 and 804 may not exhibit any ripple larger than 1 dB across the antenna beamwidth.

In some demonstrative embodiments, as shown in FIG. 8, the measured azimuth radiation patterns 802 and 804 may provide a resulting field of view in excess of 120 degrees, for example, compared to the measured azimuth radiation pattern 402 (FIG. 4) and the measured average azimuth radiation pattern 404 (FIG. 4), for example, when using the high impedance soft surface.

Referring back to FIG. 1, in some demonstrative embodiments, surface wave mitigator 122 may include a plurality of grounded dummy antenna elements surrounding the plurality of Tx antenna elements 107 and the plurality of Rx antenna elements 109, and a plurality of via fences surrounding the plurality of dummy antenna elements, e.g., as described below.

In some demonstrative embodiments, the plurality of via fences may include at least a first via fence and a second via fence, e.g., as described below.

In some demonstrative embodiments, the first via fence may surround the plurality of Tx antenna elements 107 and the plurality of Rx antenna elements 109, and the second via fence may surround the first via fence, e.g., as described below.

In other embodiments, the plurality of via fences may include more than two via fences, e.g., three, four, or more than four, via fences surrounding each other.

In some demonstrative embodiments, a distance between the first via fence and the second via fence may be based, for example, on a wavelength of the radiation pattern of the MIMO radar antenna 115, e.g., as described below.

In some demonstrative embodiments, a distance between the first via fence and the second via fence may be based, for example, on half of a guided wavelength in a dielectric layer of the PCB 120, e.g., as described below.

In some demonstrative embodiments, the plurality of grounded dummy antenna elements and the plurality of via fences may be configured to mitigate the surface waves.

In one example, dummy elements may be added at a periphery of antenna array 115. For example, the dummy elements may change a behavior of edge elements of antenna array 115 to be more similar to that of center elements of antenna array 115. For example, the dummy elements may be positioned such that each center or edge antenna element may be surrounded by a same number of antenna elements, e.g., dummy and/or real antenna elements.

In one example, surface wave mitigator 122 may be configured to utilize the dummy elements to capture the surface waves and re-radiate them to space. For example, since an un-controlled radiation of the surface waves may be converted into a controlled radiation of antenna elements, the impact of the surface waves may be leveraged, resulting with a smoother gain pattern of the antenna 115.

In some demonstrative embodiments, surface wave mitigator 122 may be configured to utilize the multiple via fences surrounding the antenna array, for example, to control residual surface waves. For example, energy from the surface waves remaining after operation of the dummy elements may be confined within the via fences, such that the surface waves may be significantly reduced. For example, the via fences may be configured to control an effective size and/or boundary conditions of the PCB ground.

Reference is made to FIG. 9A, which schematically illustrates a side view and a top view of an antenna array 915, and to FIG. 9B, which schematically illustrates a side view and a top view of the antenna array 915 with a surface wave mitigation scheme utilizing dummy elements 917 and via fences 919, in accordance with some demonstrative embodiments. For example, surface wave mitigator 122 (FIG. 1) may include, and/or may be implemented by, dummy elements 917 and via fences 919.

In some demonstrative embodiments, as shown in FIG. 9B, two via fences 919 may be used and the dummy elements 917 may be short circuited, for example, by connecting the dummy elements 917 with a via to the ground.

In other embodiments, a different number and/or configuration of via fences may be used, and/or other type of loading, e.g., a combination of passive components, resistors, inductors, capacitors, and/or the like, may be utilized, for example, depending on a specific design.

Figure 10:
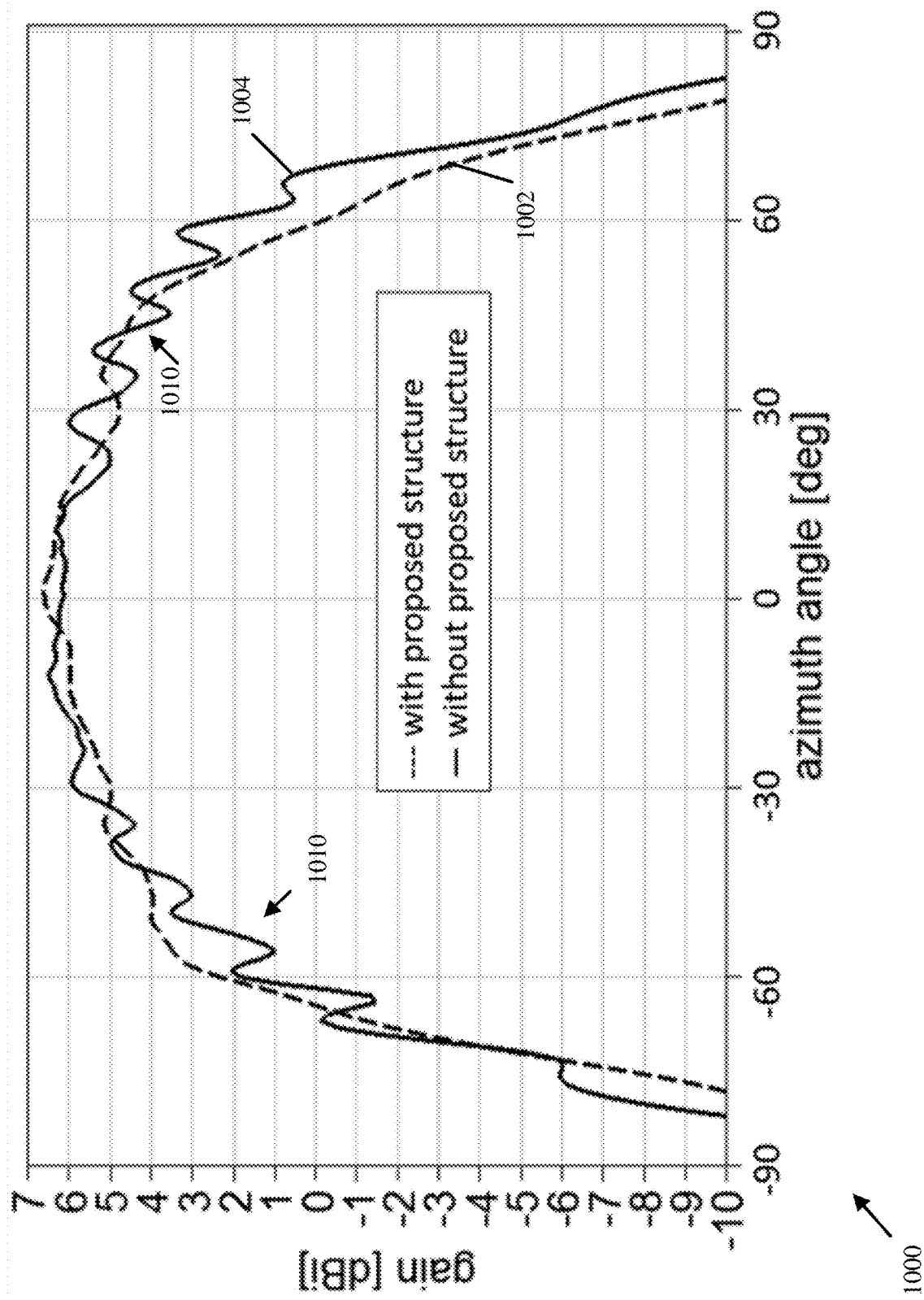
FIG. 10 is a schematic illustration of a graph depicting first and second azimuth gain patterns of an antenna, in accordance with some demonstrative embodiments.

Reference is made to FIG. 10, which schematically illustrates a graph 1000 depicting a first azimuth gain pattern 1002 and a second azimuth gain pattern 1004 of an antenna, in accordance with some demonstrative embodiments.

In one example, azimuth gain pattern 1002 depicts a co-polarized azimuth gain pattern at 78 GHz of a center element of antenna array 915 (FIG. 9) with the dummy elements 917 and the double via fens 919, and azimuth gain pattern 1004 depicts a co-polarized azimuth gain pattern of the center element of antenna array 915 (FIG. 9) without the dummy elements 917 and the double via fens 919.

In some demonstrative embodiments, as shown in FIG. 10, azimuth gain pattern 1004 may contain ripples 1010. For example, the ripples 1010 may result from interference between a radiation of the antenna center element and the contribution of the part of surface waves that radiated into space. The ripples 1010 may tend to be different from element to element, and hence may complicate a radar calibration, and may degrade a radar capability to detect a target location.

In some demonstrative embodiments, as shown in FIG. 10, azimuth gain pattern 1002 may be smoother and may have reduced ripples, which may show that an un-desired contribution of the surface waves is reduced, e.g., compared to azimuth gain pattern 1004 without the dummy elements 917 (FIG. 9) and/or the via fences 919 (FIG. 9).

Referring back to FIG. 1, in some demonstrative embodiments, the surface wave mitigator 122 may include a patterned resistor-loaded resonant structure on a dielectric layer of the PCB 120, e.g., as described below.

In some demonstrative embodiments, the patterned resistor-loaded resonant structure may include a plurality of resonant structures, and a plurality of resistors connecting between the plurality of resonant structures, e.g., as described below.

In some demonstrative embodiments, the plurality of resonant structures may include at least 10 resonant structures, e.g., as described below.

In other embodiments, the plurality of resonant structures may include any other number of resonant structures.

In some demonstrative embodiments, a resistance of a resistor of the plurality of resistors may be, for example, based on a wavelength of the radiation pattern of the MIMO radar antenna 115, e.g., as described below.

In some demonstrative embodiments, the resistance of the resistor of the plurality of resistors may be, for example, between 100 Ohm per square and 377 Ohm per square, e.g., as described below.

In other embodiments, the resistor may have any other resistance.

In some demonstrative embodiments, the patterned resistor-loaded resonant structure may include a first plurality of resistors connecting between a first resonant structure of the plurality of resonant structures and a second resonant structure of the plurality of resonant structures, and a second plurality of resistors connecting between the first resonant structure and a third resonant structure of the plurality of resonant structures, e.g., as described below.

In some demonstrative embodiments, a distance between a resistor of the first plurality of resistors and a resistor of the second plurality of resistors may be based, for example, on a wavelength of the radiation pattern of the MIMO radar antenna 115, e.g., as described below.

In some demonstrative embodiments, the distance between the resistor of the first plurality of resistors and the resistor of the second plurality of resistors may be configured, for example, to be equal to about a quarter of a wavelength of the radiation pattern of the MIMO radar antenna 115.

In some demonstrative embodiments, the distance between the resistor of the first plurality of resistors and the resistor of the second plurality of resistors may be between 0.5 mm and 0.9 mm, e.g., as described below.

In other embodiments, the resistor of the first plurality of resistors and the resistor of the second plurality of resistors may be separated by any other distance.

In some demonstrative embodiments, a first resonant structure of the plurality of resonant structures and a second resonant structure of the plurality of resonant structures may be separated by an air gap of between 0.05 mm and 0.15 mm, e.g., as described below.

In other embodiments, the first resonant structure and the second resonant structure may be separated by an air gap of any other size.

In some demonstrative embodiments, a resonant structure of the plurality of resonant structures may include a plurality of resonant cells, e.g., as described below.

In some demonstrative embodiments, the plurality of resonant cells may include at least 10 resonant cells, e.g., as described below.

In other embodiments, the plurality of resonant cells may include any other number of resonant cells.

In some demonstrative embodiments, a resonant cell of the plurality of resonant cells may be connected by a resistor of the plurality of resistors to a resonant cell of an adjacent resonant structure, e.g., as described below.

In some demonstrative embodiments, the plurality of resonant cells of the resonant structure may include a first resonant cell and a second resonant cell adjacent to the first resonant cell.

In some demonstrative embodiments, the first resonant cell may be connected by a first resistor to a first resonant cell of the adjacent resonant structure, and the second resonant cell may be connected by a second resistor to a second resonant cell of the adjacent resonant structure, e.g., as described below.

In some demonstrative embodiments, a distance between the first resistor and the second resistor may be based, for example, on a wavelength of the radiation pattern of the MIMO radar antenna 115, e.g., as described below.

In some demonstrative embodiments, the distance between the first resistor and the second resistor may be configured, for example, to be equal to about a quarter of a wavelength of the radiation pattern of the MIMO radar antenna 115.

In some demonstrative embodiments, a distance between the first resistor and the second resistor may be, for example, between 0.5 mm and 0.9 mm, e.g., as described below.

In other embodiments, the first resistor and the second resistor may be separated by any other distance.

In some demonstrative embodiments, surface wave mitigator 122 may include at least a first patterned resistor-loaded resonant structure on a first side of the Tx antenna elements 107 and the Rx antenna elements 109 of MIMO radar antenna 115, and a second patterned resistor-loaded resonant structure on a second side, opposite to the first side, of the Tx antenna elements 107 and the Rx antenna elements 109 of MIMO radar antenna 115, e.g., as described below.

In some demonstrative embodiments, the patterned resistor-loaded resonant structure may be directly printed on PCB 120, and therefore may be a very low-profile solution that may come readily with the PCB 120. For example, the patterned resistor-loaded resonant structure may not require any assembly steps, e.g., similar to the carbon-loaded plastic layer.

Figure 11:
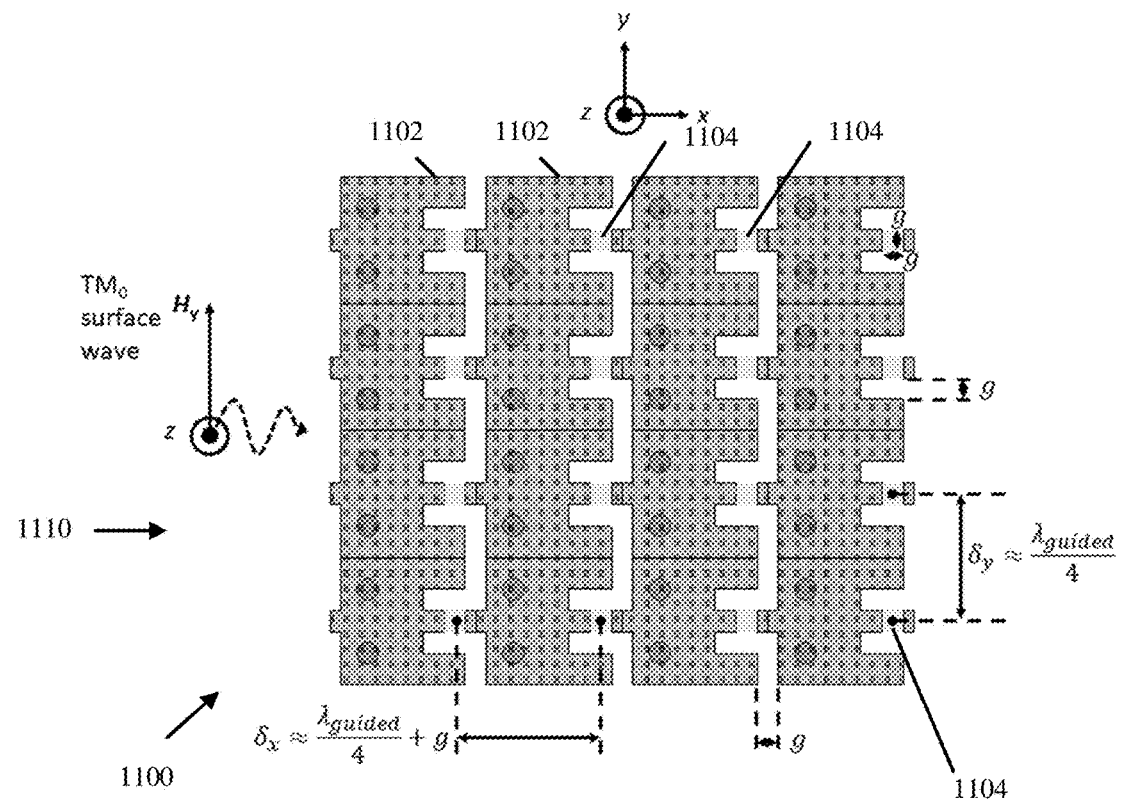
FIG. 11 is a schematic illustration of a top view and a side view of a surface wave mitigation scheme utilizing a patterned resistor-loaded resonant structure, in accordance with some demonstrative embodiments.
Figure 11:
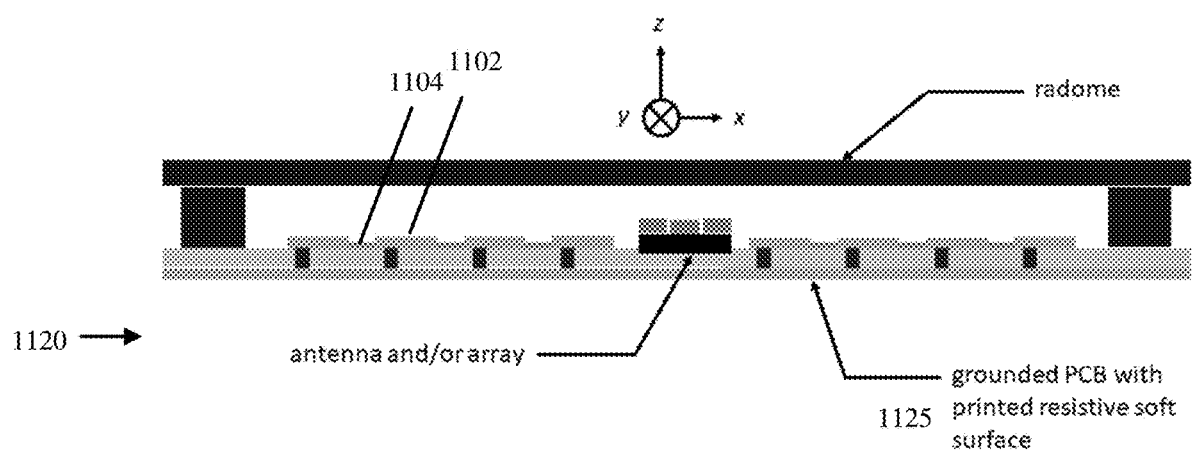

Reference is made to FIG. 11, which schematically illustrates a top view 1110 and a side view 1120 of a surface wave mitigation scheme utilizing a patterned resistor-loaded resonant structure 1100, in accordance with some demonstrative embodiments. For example, surface wave mitigator 122 (FIG. 1) may include, and/or may be implemented by, patterned resistor-loaded resonant structure 1100.

In some demonstrative embodiments, patterned resistor-loaded resonant structure 1100 may include a one-dimensional resistor-loaded soft surface composed of a 2-metal layer structure patterned on dielectric layer of a PCB 1125.

In some demonstrative embodiments, as shown in FIG. 11, the patterned resistor-loaded resonant structure 1100 may include a plurality of resonant structures 1102, and a plurality of resistors 1104 connecting between the plurality of resonant structures 1102, e.g., as described below.

In some demonstrative embodiments, as shown in FIG. 11, a distance, denoted δy, between first and second adjacent vertical resistors 1104, may be based, for example, on the wavelength of a radiation pattern of the MIMO radar antenna 115 (FIG. 1), e.g., as described below.

In some demonstrative embodiments, the distance δy may be between 0.5 mm and 0.9 mm. In other embodiments, any other distance δy may be implemented.

In some demonstrative embodiments, as shown in FIG. 11, a distance, denoted δx, between first and second adjacent horizontal resistors 1104, may be based, for example, on a wavelength of a radiation pattern of the MIMO radar antenna 115 (FIG. 1), e.g., as described below.

In some demonstrative embodiments, the distance δx may be between 0.5 mm and 0.9 mm. In other embodiments, any other distance δx may be implemented.

In some demonstrative embodiments, as shown in FIG. 11, an air gap, denoted g, may separate between a first resonant structure of the plurality of resonant structures 1102 and a second resonant structure of the plurality of resonant structures 1102.

In some demonstrative embodiments, as shown in FIG. 11, the air gap g, may also separate between one or more portions of a resonant structure and a resistor.

In some demonstrative embodiments the air gap g may be between 0.05 mm and 0.15 mm, or between any other numbers. In other embodiments, any other air gap g may be implemented.

Figure 12:
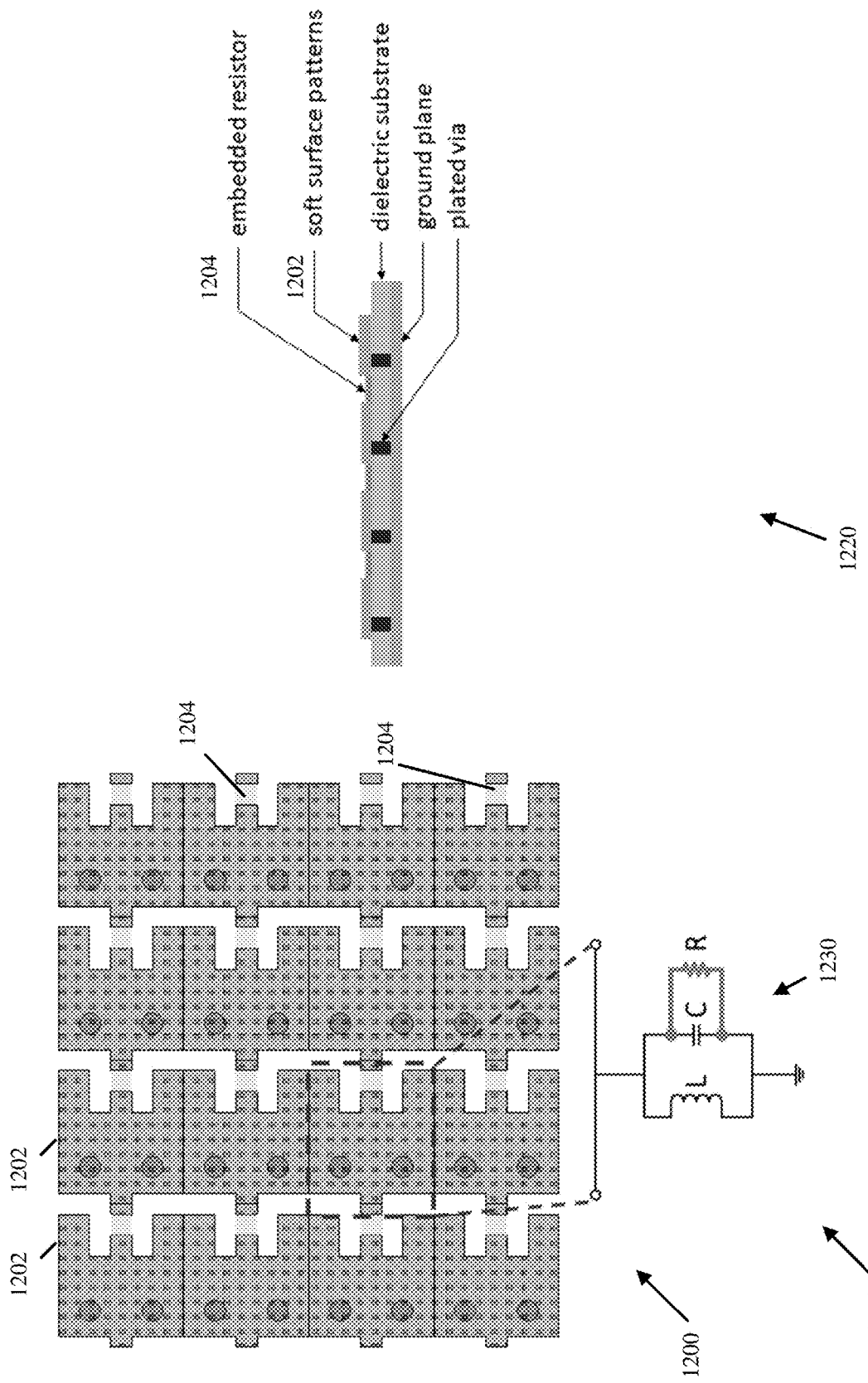
FIG. 12 is a schematic illustration of a top view and a side view of a surface wave mitigation scheme utilizing a patterned resistor-loaded resonant structure, in accordance with some demonstrative embodiments.

Reference is made to FIG. 12, which schematically illustrates a top view 1210 and aside view 1220 of a surface wave mitigation scheme utilizing a patterned resistor-loaded resonant structure 1200, in accordance with some demonstrative embodiments. For example, surface wave mitigator 122 (FIG. 1) may include, and/or may be implemented by, patterned resistor-loaded resonant structure 1200.

In some demonstrative embodiments, patterned resistor-loaded resonant structure 1200 may include a one-dimensional resistor-loaded soft surface composed of a 2-metal layer structure patterned on a dielectric substrate.

In some demonstrative embodiments, as shown in FIG. 12, the patterned resistor-loaded resonant structure 1200 may include an array of a plurality of resonant structures 1202, and a plurality of resistors 1204 connecting between the plurality of resonant structures 1202, e.g., as described below.

In one example, the array of resonant structures 1202 may be configured to form a high order stopband filter to prevent a $TM_0$ surface wave from propagating along the dielectric surface, e.g., as described below.

An equivalent surface admittance, denoted $Y_{soft}$, of a single resonant structure without resistor loading may be determined, e.g., as follows:

$$Y_{soft} = \frac{1}{j\omega L} + j\omega C \qquad (1)$$

For example, at resonance, the surface admittance $Y_{soft}$ may be equal to zero, e.g., $Y_{soft} \approx 0$, and, therefore, the soft surface without resistor loading may exhibit a high surface impedance, which may not be desired. For example, near resonance, half of the surface wave energy may be reflected and half may be lost.

In one example, this behavior may not be desired in an antenna, for example, since scattered surface waves may be combined with the antenna main beam in free space and may result in radiation pattern distortions.

In some demonstrative embodiments, a shunt resistor, e.g., resistors 1204, may be implemented, for example, in gaps between adjacent resonant structures 1202, for example, to mitigate the impact of surface waves, e.g., as described below.

In some demonstrative embodiments, a surface admittance, denoted $Y_{R,soft}$, of resistor-loaded resonant structure 1230 may be determined, e.g., as follows:

$$Y_{R,soft} = \frac{1}{j\omega L} + j\omega C + R \qquad (2)$$

In some demonstrative embodiments, at resonance, the surface admittance $Y_{R,soft}$ of the resistor-loaded resonant structure 1230 may be equal to the resistance of the resistor R, e.g., $Y_{R,soft} \approx R$.

In some demonstrative embodiments, resistor-loaded resonant structure 1230 may be configured to have a surface wave impedance, which may be matched with the resistance R, for example, to dissipate most of the surface waves currents into the resistor array.

In some demonstrative embodiments, a resistance value of the resistor-loaded resonant structure 1230 may be between a system reference impedance and a free-space wave impedance, e.g., 377Ω.

In some demonstrative embodiments, implementing a resistor load having a resistance of R=250 Ohm per Square (Ω/□) may improve a ratio of reflected power, for example, while keeping a ratio of transmitted power low, e.g., as described below.

Figure 13:
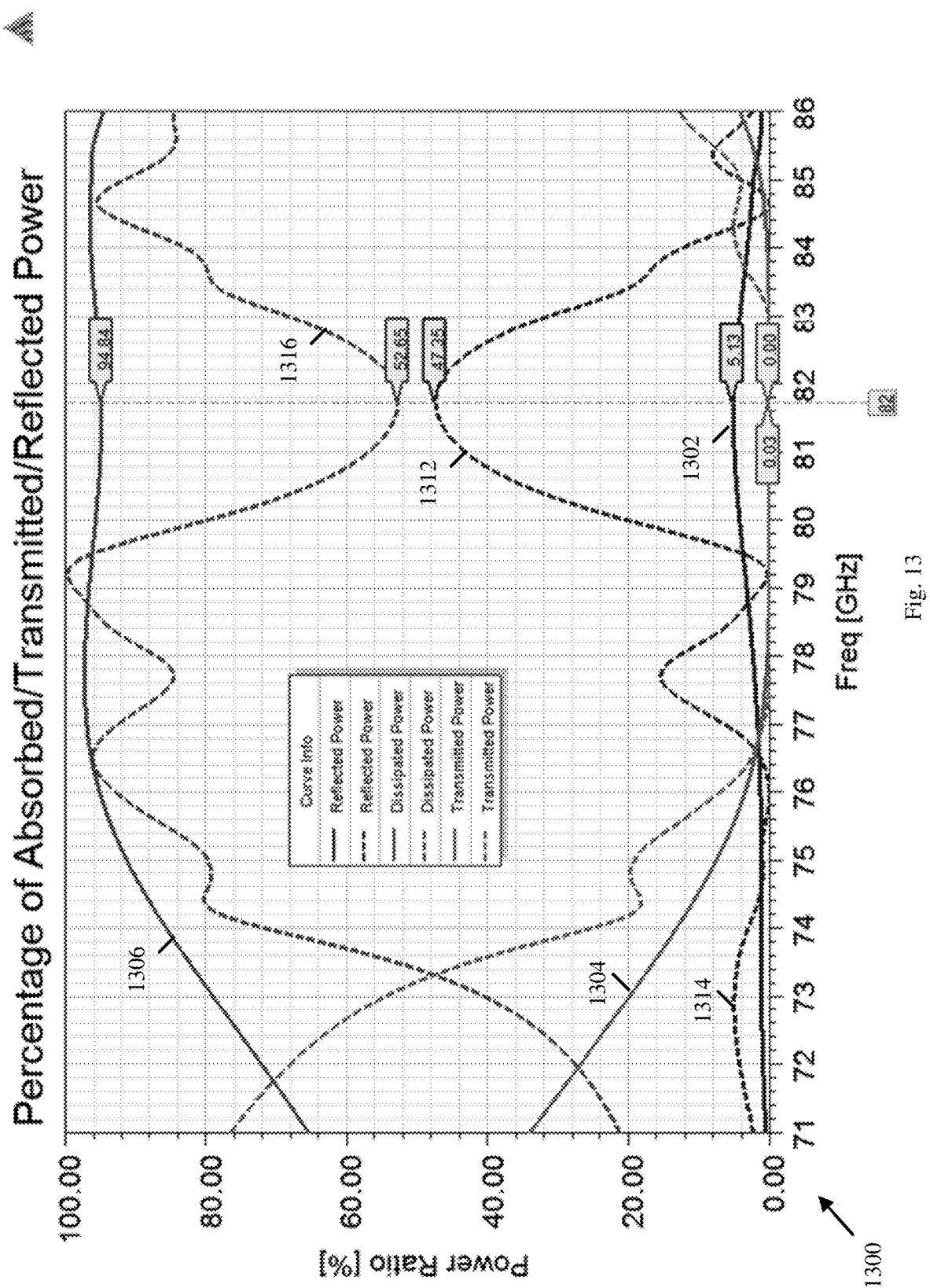
FIG. 13 is a schematic illustration of a graph depicting electromagnetic properties of a patterned resistor-loaded resonant structure versus a high impedance soft surface, in accordance with some demonstrative embodiments.

Reference is made to FIG. 13, which schematically illustrates a graph 1300 depicting electromagnetic properties of a high impedance soft surface versus a patterned resistor-loaded resonant structure, in accordance with some demonstrative embodiments.

In one example, as shown in FIG. 13, a curve 1302 depicts a reflection of power versus a frequency response, a curve 1304 depicts a transmission of power versus the frequency response, and a curve 1306 depicts a dissipation of power versus the frequency response. For example, curves 1302, 1304 and 1306 may depict electromagnetic properties of a surface wave mitigator 122 (FIG. 1) including a patterned resistor-loaded resonant structure.

In one example, the patterned resistor-loaded resonant structure may be loaded with a resistor having resistance of R=250Ω/□.

In one example, as shown in FIG. 13, a curve 1312 depicts a reflection of power versus a frequency response, a curve 1314 depicts a transmission of power versus the frequency response, and a curve 1316 depicts a dissipation of power versus the frequency response. For example, curves 1312, 1314 and 1316 may be based on values, which may be measured utilizing a high impedance soft surface.

In some demonstrative embodiments, as shown in FIG. 13, patterned resistor-loaded resonant structure may have a decreased reflected power, e.g., of about 5%, while keeping a decreased ratio of transmitted power.

In some demonstrative embodiments, according to curve 1306 the patterned resistor-loaded resonant structure may effectively dissipate more than 90% of power of the surface wave currents. In contrast, according to curves 1312 and 1314, near resonance, the high impedance soft surface may reflect about 50% of the surface waves, and may dissipate only about 50% of the surface waves.

In some demonstrative embodiments, a quality factor of the patterned resistor-loaded resonant structure 1200 (FIG. 12) may be significantly reduced, for example, due to ohmic loss, which may increase an operating bandwidth of the resistor-loaded soft surface, e.g., compared to the high impedance surface without resistive loading.

In some demonstrative embodiments, a one-dimensional resistor-loaded soft surface may be extended to a two-dimensional structure, for example, to suppress surface waves in another principle plane.

In some demonstrative embodiments, patterned resistor-loaded resonant structure 1200 (FIG. 12) may include a distributed resistor pattern including a plurality of resistors, e.g., rather than a single constant resistance R, having values, for example, based on system reference impedance, e.g., system reference impedance→R1→R2→ . . . →377Ω, for example rather than a single constant resistance R.

Figure 14B:
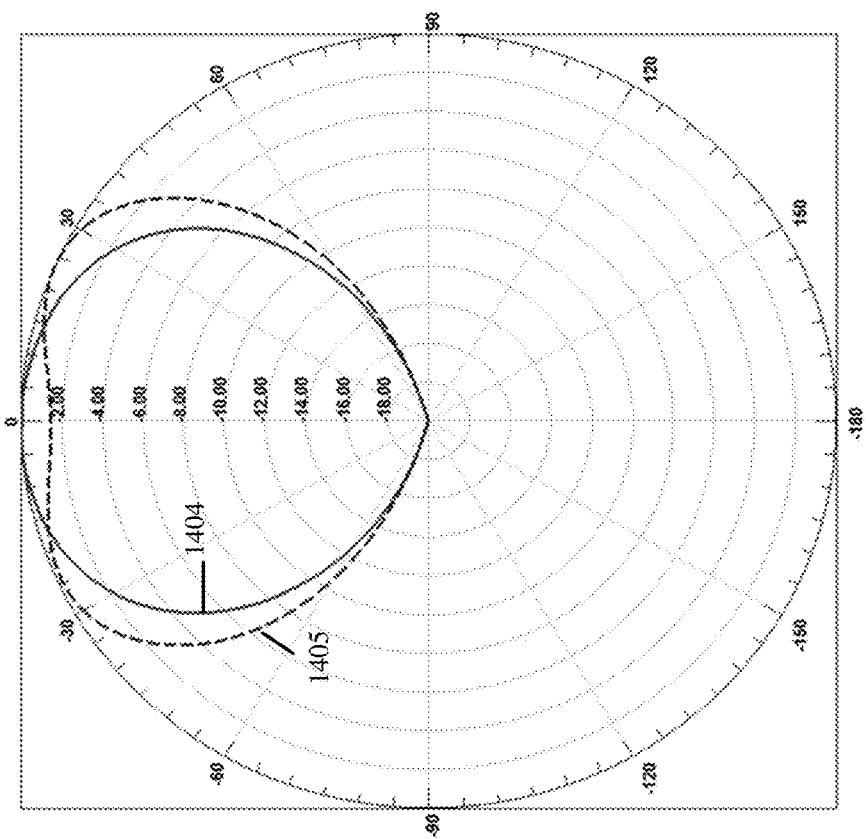
FIG. 14B is a schematic illustration of an elevation radiation pattern of the antenna, in accordance with some demonstrative embodiments.
Figure 14A:
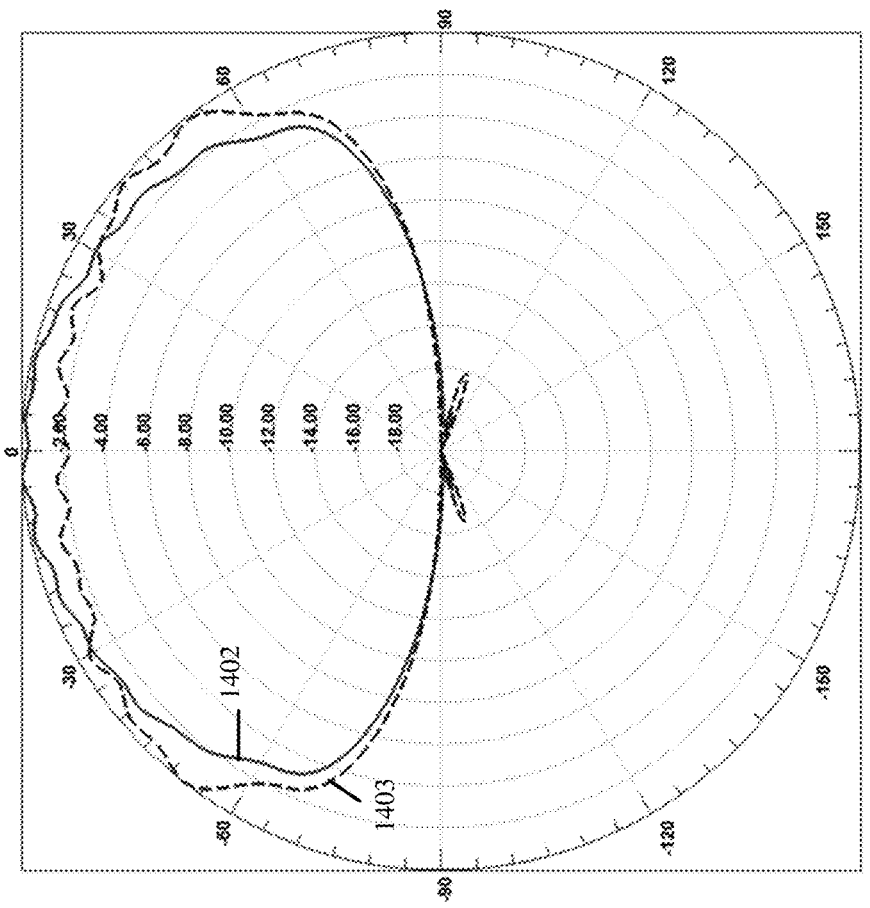
FIG. 14A is a schematic illustration of an azimuth radiation pattern of an antenna.

Reference is made to FIG. 14A, which schematically illustrates an azimuth radiation pattern of an antenna, and to FIG. 14B, which schematically illustrates an elevation radiation pattern of the antenna, in accordance with some demonstrative embodiments.

In one example, FIGS. 14A and 14B may compare radiation patterns of a single antenna element surrounded by the high impendence soft surface, and radiation patterns of the single antenna element surrounded by a patterned resistor-loaded resonant structure, e.g., patterned resistor-loaded resonant structure 1100 (FIG. 11), or patterned resistor-loaded resonant structure 1200 (FIG. 12).

In one example, MIMO antenna 115 (FIG. 1) may be configured to radiate radiation patterns 1402 and 1404, for example, when surface wave mitigator 122 (FIG. 1) utilizes a patterned resistor-loaded resonant structure, e.g., patterned resistor-loaded resonant structure 1100 (FIG. 11) or patterned resistor-loaded resonant structure 1200 (FIG. 12).

In some demonstrative embodiments, as shown in FIGS. 14A and 14B, the patterned resistor-loaded resonant structure may maintain smooth radiation patterns 1402 and 1404, e.g., compared to a high impedance soft surface, which may result in distorted radiation patterns 1403 and 1405 with gain reduction, e.g., at boresight in both azimuth and elevation planes.

Figure 15:
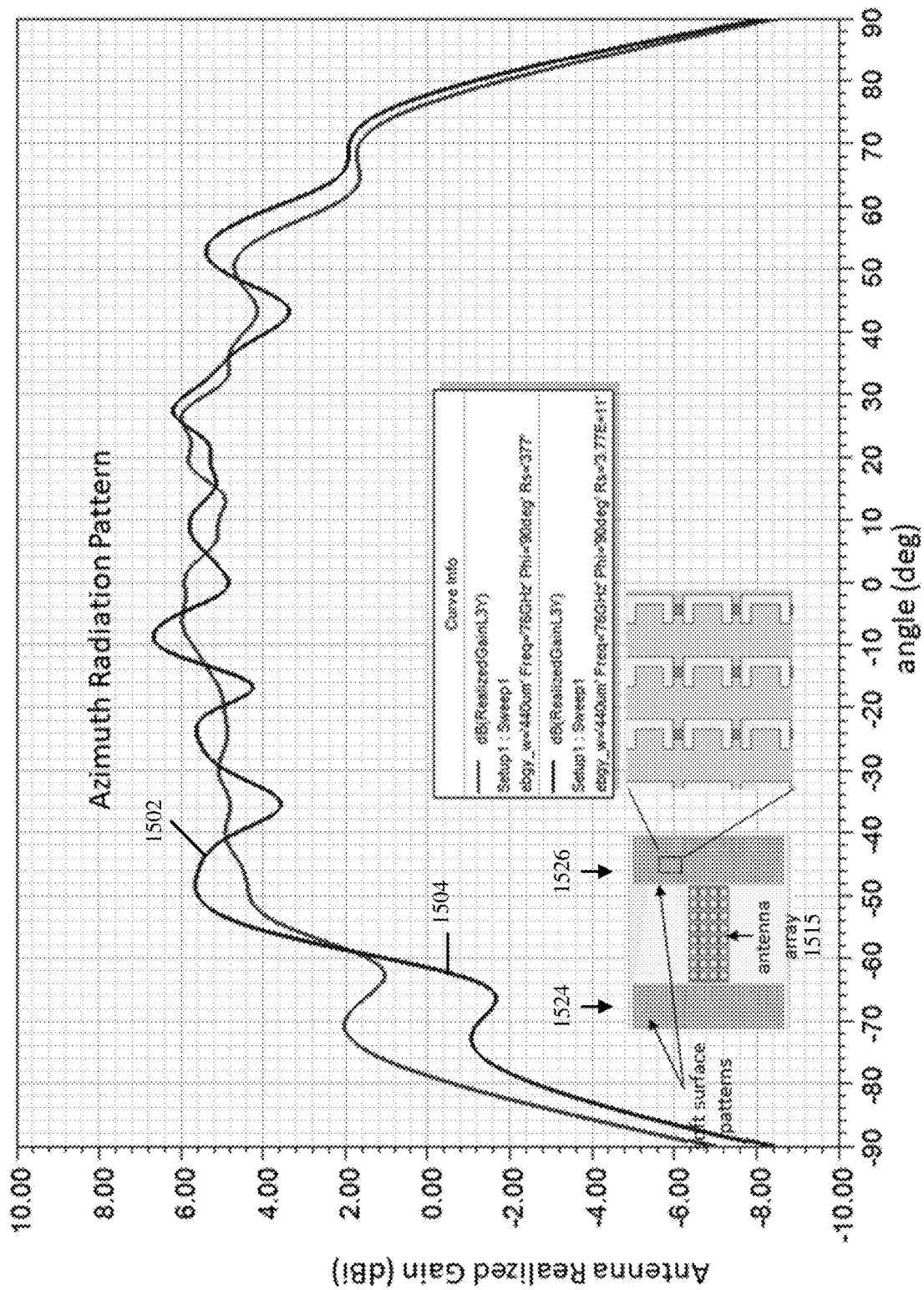
FIG. 15 is a schematic illustration of first and second azimuth radiation patterns, in accordance with some demonstrative embodiments.

Reference is made to FIG. 15, which schematically illustrates a first azimuth radiation pattern 1502 and a second azimuth radiation pattern 1504, in accordance with some demonstrative embodiments.

In one example, azimuth radiation pattern 1502 may represent simulated azimuth radiation patterns of a MIMO antenna 1515 (FIG. 1), e.g., MIMO antenna 115 (FIG. 1), surrounded by a patterned resistor-loaded resonant structure; and azimuth radiation pattern 1504 may represent simulated azimuth radiation patterns of a MIMO antenna surrounded by a high impendence soft surface.

In some demonstrative embodiments, as shown in FIG. 15, a PCB 1520 may include at least a first patterned resistor-loaded resonant structure 1524 on a first side of MIMO antenna 1515, and a second patterned resistor-loaded resonant structure 1526 on a second side, opposite to the first side, of MIMO antenna 1515.

In some demonstrative embodiments, as shown in FIG. 15, azimuth radiation pattern 1502 may maintain a smoother azimuth radiation pattern in a field of view that excess 120 degrees, e.g., compared to azimuth radiation pattern 1504, which shows a narrower field of view and notches.

EXAMPLES

The following examples pertain to further embodiments.

Example 1 includes an apparatus comprising a Printed Circuit Board (PCB); a Multiple-Input-Multiple-Output (MIMO) radar antenna on the PCB, the MIMO radar antenna comprising a plurality of Transmit (Tx) antenna elements configured to transmit Tx radar signals, and a plurality of receive (Rx) antenna elements configured to receive Rx radar signals based on the Tx radar signals; and a surface wave mitigator connected to the PCB, the surface wave mitigator configured to mitigate an impact of surface waves via the PCB on a radiation pattern of the MIMO radar antenna.

Example 2 includes the subject matter of Example 1, and optionally, wherein the surface wave mitigator comprises a carbon-loaded plastic layer on the PCB.

Example 3 includes the subject matter of Example 2, and optionally, wherein the carbon-loaded plastic layer comprises carbon-fiber-loaded plastic.

Example 4 includes the subject matter of Example 2 or 3, and optionally, wherein the carbon-loaded plastic layer is configured as a spacer between the PCB and a radome over the MIMO radar antenna.

Example 5 includes the subject matter of any one of Examples 2-4, and optionally, wherein a volume resistivity of the carbon-loaded plastic layer is between 2 Ohm-centimeter (Ohm*cm) and 40 Ohm*cm.

Example 6 includes the subject matter of any one of Examples 2-5, and optionally, wherein a volume resistivity of the carbon-loaded plastic layer is between 5 Ohm-centimeter (Ohm*cm) and 35 Ohm*cm.

Example 7 includes the subject matter of any one of Examples 2-6, and optionally, wherein a volume resistivity of the carbon-loaded plastic layer is between 9 Ohm-centimeter (Ohm*cm) and 11 Ohm*cm.

Example 8 includes the subject matter of Example 1, and optionally, wherein the surface wave mitigator comprises a plurality of grounded dummy antenna elements surrounding the plurality of Tx and Rx antenna elements, and a plurality of via fences surrounding the plurality of dummy antenna elements.

Example 9 includes the subject matter of Example 8, and optionally, wherein the plurality of via fences comprises at least a first via fence and a second via fence, the first via fence surrounding the plurality of Tx and Rx antenna elements, the second via fence surrounding the first via fence.

Example 10 includes the subject matter of Example 9, and optionally, wherein a distance between the first via fence and the second via fence is based on a wavelength of the radiation pattern of the MIMO radar antenna.

Example 11 includes the subject matter of Example 9 or 10, and optionally, wherein a distance between the first via fence and the second via fence is based on half of a guided wavelength in a dielectric layer of the PCB.

Example 12 includes the subject matter of Example 1, and optionally, wherein the surface wave mitigator comprises a patterned resistor-loaded resonant structure on a dielectric layer of the PCB.

Example 13 includes the subject matter of Example 12, and optionally, wherein the patterned resistor-loaded resonant structure comprises a plurality of resonant structures, and a plurality of resistors connecting between the plurality of resonant structures.

Example 14 includes the subject matter of Example 13, and optionally, wherein the patterned resistor-loaded resonant structure comprises a first plurality of resistors connecting between a first resonant structure of the plurality of resonant structures and a second resonant structure of the plurality of resonant structures, and a second plurality of resistors connecting between the first resonant structure and a third resonant structure of the plurality of resonant structures.

Example 15 includes the subject matter of any one of Examples 14, and optionally, wherein a distance between a resistor of the first plurality of resistors and a resistor of the second plurality of resistors is based on a wavelength of the radiation pattern of the MIMO radar antenna.

Example 16 includes the subject matter of Example 14 or 15, and optionally, wherein a distance between a resistor of the first plurality of resistors and a resistor of the second plurality of resistors is between 0.5 millimeter (mm) and 0.9 mm.

Example 17 includes the subject matter of any one of Examples 13-16, and optionally, wherein a first resonant structure of the plurality of resonant structures and a second resonant structure of the plurality of resonant structures are separated by an air gap of between 0.05 millimeter (mm) and 0.15 mm.

Example 18 includes the subject matter of any one of Examples 13-17, and optionally, wherein a resonant structure of the plurality of resonant structures comprises a plurality of resonant cells, a resonant cell of the plurality of resonant cells is connected by a resistor of the plurality of resistors to a resonant cell of an adjacent resonant structure.

Example 19 includes the subject matter of Example 18, and optionally, wherein the plurality of resonant cells of the resonant structure comprises a first resonant cell and a second resonant cell adjacent to the first resonant cell, the first resonant cell connected by a first resistor to a first resonant cell of the adjacent resonant structure, the second resonant cell connected by a second resistor to a second resonant cell of the adjacent resonant structure.

Example 20 includes the subject matter of Example 19, and optionally, wherein a distance between the first resistor and the second resistor is based on a wavelength of the radiation pattern of the MIMO radar antenna.

Example 21 includes the subject matter of Example 19 or 20, and optionally, wherein a distance between the first resistor and the second resistor is between 0.5 millimeter (mm) and 0.9 mm.

Example 22 includes the subject matter of any one of Examples 18-21, and optionally, wherein the plurality of resonant cells comprises at least 10 resonant cells.

Example 23 includes the subject matter of any one of Examples 13-22, and optionally, wherein a resistance of a resistor of the plurality of resistors is based on a wavelength of the radiation pattern of the MIMO radar antenna.

Example 24 includes the subject matter of any one of Examples 13-23, and optionally, wherein a resistance of a resistor of the plurality of resistors is between 100 Ohm per square and 377 Ohm per square.

Example 25 includes the subject matter of any one of Examples 13-24, and optionally, comprising at least a first patterned resistor-loaded resonant structure on a first side of the Tx and Rx antenna elements, and a second patterned resistor-loaded resonant structure on a second side, opposite to the first side, of the Tx and Rx antenna elements.

Example 26 includes the subject matter of any one of Examples 13-25, and optionally, wherein the plurality of resonant structures comprises at least 10 resonant structures.

Example 27 includes the subject matter of any one of Examples 1-26, and optionally, wherein the surface wave mitigator is configured to mitigate the impact of the surface waves on a main lobe of the radiation pattern of the MIMO radar antenna.

Example 28 includes the subject matter of any one of Examples 1-27, and optionally, wherein the surface wave mitigator is configured to mitigate the impact of the surface waves on a main lobe of an azimuth radiation pattern of the MIMO radar antenna.

Example 29 includes the subject matter of Example 28, and optionally, wherein the surface wave mitigator is configured to mitigate the impact of the surface waves in a field of view of at least 110 degrees of the azimuth radiation pattern of the MIMO radar antenna.

Example 30 includes the subject matter of any one of Examples 1-29, and optionally, wherein the surface wave mitigator is configured to mitigate the impact of the surface waves on a main lobe of an elevation radiation pattern of the MIMO radar antenna.

Example 31 includes the subject matter of any one of Examples 1-30, and optionally, comprising a radar processor configured to detect one or more targets based on the Rx radar signals.

Example 32 includes the subject matter of any one of Examples 1-31, and optionally, comprising a vehicle.

Example 33 includes a radar device comprising a Printed Circuit Board (PCB); a Multiple-Input-Multiple-Output (MIMO) radar antenna on the PCB, the MIMO radar antenna comprising a plurality of Transmit (Tx) antenna elements configured to transmit Tx radar signals, and a plurality of receive (Rx) antenna elements configured to receive Rx radar signals based on the Tx radar signals; a surface wave mitigator connected to the PCB, the surface wave mitigator configured to mitigate an impact of surface waves via the PCB on a radiation pattern of the MIMO radar antenna; and a radar processor configured to detect one or more targets based on the Rx radar signals.

Example 34 includes the subject matter of Example 33, and optionally, wherein the surface wave mitigator comprises a carbon-loaded plastic layer on the PCB.

Example 35 includes the subject matter of Example 34, and optionally, wherein the carbon-loaded plastic layer comprises carbon-fiber-loaded plastic.

Example 36 includes the subject matter of Example 34 or 35, and optionally, wherein the carbon-loaded plastic layer is configured as a spacer between the PCB and a radome over the MIMO radar antenna.

Example 37 includes the subject matter of any one of Examples 34-36, and optionally, wherein a volume resistivity of the carbon-loaded plastic layer is between 2 Ohm-centimeter (Ohm*cm) and 40 Ohm*cm.

Example 38 includes the subject matter of any one of Examples 34-37, and optionally, wherein a volume resistivity of the carbon-loaded plastic layer is between 5 Ohm-centimeter (Ohm*cm) and 35 Ohm*cm.

Example 39 includes the subject matter of any one of Examples 34-38, and optionally, wherein a volume resistivity of the carbon-loaded plastic layer is between 9 Ohm-centimeter (Ohm*cm) and 11 Ohm*cm.

Example 40 includes the subject matter of Example 33, and optionally, wherein the surface wave mitigator comprises a plurality of grounded dummy antenna elements surrounding the plurality of Tx and Rx antenna elements, and a plurality of via fences surrounding the plurality of dummy antenna elements.

Example 41 includes the subject matter of Example 40, and optionally, wherein the plurality of via fences comprises at least a first via fence and a second via fence, the first via fence surrounding the plurality of Tx and Rx antenna elements, the second via fence surrounding the first via fence.

Example 42 includes the subject matter of Example 41, and optionally, wherein a distance between the first via fence and the second via fence is based on a wavelength of the radiation pattern of the MIMO radar antenna.

Example 43 includes the subject matter of Example 41 or 42, and optionally, wherein a distance between the first via fence and the second via fence is based on half of a guided wavelength in a dielectric layer of the PCB.

Example 44 includes the subject matter of Example 33, and optionally, wherein the surface wave mitigator comprises a patterned resistor-loaded resonant structure on a dielectric layer of the PCB.

Example 45 includes the subject matter of Example 44, and optionally, wherein the patterned resistor-loaded resonant structure comprises a plurality of resonant structures, and a plurality of resistors connecting between the plurality of resonant structures.

Example 46 includes the subject matter of Example 45, and optionally, wherein the patterned resistor-loaded resonant structure comprises a first plurality of resistors connecting between a first resonant structure of the plurality of resonant structures and a second resonant structure of the plurality of resonant structures, and a second plurality of resistors connecting between the first resonant structure and a third resonant structure of the plurality of resonant structures.

Example 47 includes the subject matter of any one of Examples 46, and optionally, wherein a distance between a resistor of the first plurality of resistors and a resistor of the second plurality of resistors is based on a wavelength of the radiation pattern of the MIMO radar antenna.

Example 48 includes the subject matter of Example 46 or 47, and optionally, wherein a distance between a resistor of the first plurality of resistors and a resistor of the second plurality of resistors is between 0.5 millimeter (mm) and 0.9 mm.

Example 49 includes the subject matter of any one of Examples 45-48, and optionally, wherein a first resonant structure of the plurality of resonant structures and a second resonant structure of the plurality of resonant structures are separated by an air gap of between 0.05 millimeter (mm) and 0.15 mm.

Example 50 includes the subject matter of any one of Examples 45-49, and optionally, wherein a resonant structure of the plurality of resonant structures comprises a plurality of resonant cells, a resonant cell of the plurality of resonant cells is connected by a resistor of the plurality of resistors to a resonant cell of an adjacent resonant structure.

Example 51 includes the subject matter of Example 50, and optionally, wherein the plurality of resonant cells of the resonant structure comprises a first resonant cell and a second resonant cell adjacent to the first resonant cell, the first resonant cell connected by a first resistor to a first resonant cell of the adjacent resonant structure, the second resonant cell connected by a second resistor to a second resonant cell of the adjacent resonant structure.

Example 52 includes the subject matter of Example 51, and optionally, wherein a distance between the first resistor and the second resistor is based on a wavelength of the radiation pattern of the MIMO radar antenna.

Example 53 includes the subject matter of Example 51 or 52, and optionally, wherein a distance between the first resistor and the second resistor is between 0.5 millimeter (mm) and 0.9 mm.

Example 54 includes the subject matter of any one of Examples 50-53, and optionally, wherein the plurality of resonant cells comprises at least 10 resonant cells.

Example 55 includes the subject matter of any one of Examples 45-54, and optionally, wherein a resistance of a resistor of the plurality of resistors is based on a wavelength of the radiation pattern of the MIMO radar antenna.

Example 56 includes the subject matter of any one of Examples 45-55, and optionally, wherein a resistance of a resistor of the plurality of resistors is between 100 Ohm per square and 377 Ohm per square.

Example 57 includes the subject matter of any one of Examples 45-56, and optionally, comprising at least a first patterned resistor-loaded resonant structure on a first side of the Tx and Rx antenna elements, and a second patterned resistor-loaded resonant structure on a second side, opposite to the first side, of the Tx and Rx antenna elements.

Example 58 includes the subject matter of any one of Examples 45-57, and optionally, wherein the plurality of resonant structures comprises at least 10 resonant structures.

Example 59 includes the subject matter of any one of Examples 33-58, and optionally, wherein the surface wave mitigator is configured to mitigate the impact of the surface waves on a main lobe of the radiation pattern of the MIMO radar antenna.

Example 60 includes the subject matter of any one of Examples 33-59, and optionally, wherein the surface wave mitigator is configured to mitigate the impact of the surface waves on a main lobe of an azimuth radiation pattern of the MIMO radar antenna.

Example 61 includes the subject matter of Example 60, and optionally, wherein the surface wave mitigator is configured to mitigate the impact of the surface waves in a field of view of at least 110 degrees of the azimuth radiation pattern of the MIMO radar antenna.

Example 62 includes the subject matter of any one of Examples 33-61, and optionally, wherein the surface wave mitigator is configured to mitigate the impact of the surface waves on a main lobe of an elevation radiation pattern of the MIMO radar antenna.

Example 63 includes a vehicle comprising a system controller configured to control one or more vehicular systems of the vehicle based on radar information; and a radar device configured to provide the radar information to the system controller, the radar device comprising a Printed Circuit Board (PCB); a Multiple-Input-Multiple-Output (MIMO) radar antenna on the PCB, the MIMO radar antenna comprising a plurality of Transmit (Tx) antenna elements configured to transmit Tx radar signals, and a plurality of receive (Rx) antenna elements configured to receive Rx radar signals based on the Tx radar signals; a surface wave mitigator connected to the PCB, the surface wave mitigator configured to mitigate an impact of surface waves via the PCB on a radiation pattern of the MIMO radar antenna; and a radar processor configured to provide the radar information based on the Rx radar signals.

Example 64 includes the subject matter of Example 63, and optionally, wherein the surface wave mitigator comprises a carbon-loaded plastic layer on the PCB.

Example 65 includes the subject matter of Example 64, and optionally, wherein the carbon-loaded plastic layer comprises carbon-fiber-loaded plastic.

Example 66 includes the subject matter of Example 64 or 65, and optionally, wherein the carbon-loaded plastic layer is configured as a spacer between the PCB and a radome over the MIMO radar antenna.

Example 67 includes the subject matter of any one of Examples 64-66, and optionally, wherein a volume resistivity of the carbon-loaded plastic layer is between 2 Ohm-centimeter (Ohm*cm) and 40 Ohm*cm.

Example 68 includes the subject matter of any one of Examples 64-67, and optionally, wherein a volume resistivity of the carbon-loaded plastic layer is between 5 Ohm-centimeter (Ohm*cm) and 35 Ohm*cm.

Example 69 includes the subject matter of any one of Examples 64-68, and optionally, wherein a volume resistivity of the carbon-loaded plastic layer is between 9 Ohm-centimeter (Ohm*cm) and 11 Ohm*cm.

Example 70 includes the subject matter of Example 63, and optionally, wherein the surface wave mitigator comprises a plurality of grounded dummy antenna elements surrounding the plurality of Tx and Rx antenna elements, and a plurality of via fences surrounding the plurality of dummy antenna elements.

Example 71 includes the subject matter of Example 70, and optionally, wherein the plurality of via fences comprises at least a first via fence and a second via fence, the first via fence surrounding the plurality of Tx and Rx antenna elements, the second via fence surrounding the first via fence.

Example 72 includes the subject matter of Example 71, and optionally, wherein a distance between the first via fence and the second via fence is based on a wavelength of the radiation pattern of the MIMO radar antenna.

Example 73 includes the subject matter of Example 71 or 72, and optionally, wherein a distance between the first via fence and the second via fence is based on half of a guided wavelength in a dielectric layer of the PCB.

Example 74 includes the subject matter of Example 63, and optionally, wherein the surface wave mitigator comprises a patterned resistor-loaded resonant structure on a dielectric layer of the PCB.

Example 75 includes the subject matter of Example 74, and optionally, wherein the patterned resistor-loaded resonant structure comprises a plurality of resonant structures, and a plurality of resistors connecting between the plurality of resonant structures.

Example 76 includes the subject matter of Example 75, and optionally, wherein the patterned resistor-loaded resonant structure comprises a first plurality of resistors connecting between a first resonant structure of the plurality of resonant structures and a second resonant structure of the plurality of resonant structures, and a second plurality of resistors connecting between the first resonant structure and a third resonant structure of the plurality of resonant structures.

Example 77 includes the subject matter of any one of Examples 76, and optionally, wherein a distance between a resistor of the first plurality of resistors and a resistor of the second plurality of resistors is based on a wavelength of the radiation pattern of the MIMO radar antenna.

Example 78 includes the subject matter of Example 76 or 77, and optionally, wherein a distance between a resistor of the first plurality of resistors and a resistor of the second plurality of resistors is between 0.5 millimeter (mm) and 0.9 mm.

Example 79 includes the subject matter of any one of Examples 75-78, and optionally, wherein a first resonant structure of the plurality of resonant structures and a second resonant structure of the plurality of resonant structures are separated by an air gap of between 0.05 millimeter (mm) and 0.15 mm.

Example 80 includes the subject matter of any one of Examples 75-79, and optionally, wherein a resonant structure of the plurality of resonant structures comprises a plurality of resonant cells, a resonant cell of the plurality of resonant cells is connected by a resistor of the plurality of resistors to a resonant cell of an adjacent resonant structure.

Example 81 includes the subject matter of Example 80, and optionally, wherein the plurality of resonant cells of the resonant structure comprises a first resonant cell and a second resonant cell adjacent to the first resonant cell, the first resonant cell connected by a first resistor to a first resonant cell of the adjacent resonant structure, the second resonant cell connected by a second resistor to a second resonant cell of the adjacent resonant structure.

Example 82 includes the subject matter of Example 81, and optionally, wherein a distance between the first resistor and the second resistor is based on a wavelength of the radiation pattern of the MIMO radar antenna.

Example 83 includes the subject matter of Example 81 or 82, and optionally, wherein a distance between the first resistor and the second resistor is between 0.5 millimeter (mm) and 0.9 mm.

Example 84 includes the subject matter of any one of Examples 80-83, and optionally, wherein the plurality of resonant cells comprises at least 10 resonant cells.

Example 85 includes the subject matter of any one of Examples 75-84, and optionally, wherein a resistance of a resistor of the plurality of resistors is based on a wavelength of the radiation pattern of the MIMO radar antenna.

Example 86 includes the subject matter of any one of Examples 75-85, and optionally, wherein a resistance of a resistor of the plurality of resistors is between 100 Ohm per square and 377 Ohm per square.

Example 87 includes the subject matter of any one of Examples 75-86, and optionally, comprising at least a first patterned resistor-loaded resonant structure on a first side of the Tx and Rx antenna elements, and a second patterned resistor-loaded resonant structure on a second side, opposite to the first side, of the Tx and Rx antenna elements.

Example 88 includes the subject matter of any one of Examples 75-87, and optionally, wherein the plurality of resonant structures comprises at least 10 resonant structures.

Example 89 includes the subject matter of any one of Examples 63-88, and optionally, wherein the surface wave mitigator is configured to mitigate the impact of the surface waves on a main lobe of the radiation pattern of the MIMO radar antenna.

Example 90 includes the subject matter of any one of Examples 63-89, and optionally, wherein the surface wave mitigator is configured to mitigate the impact of the surface waves on a main lobe of an azimuth radiation pattern of the MIMO radar antenna.

Example 91 includes the subject matter of Example 90, and optionally, wherein the surface wave mitigator is configured to mitigate the impact of the surface waves in a field of view of at least 110 degrees of the azimuth radiation pattern of the MIMO radar antenna.

Example 92 includes the subject matter of any one of Examples 63-91, and optionally, wherein the surface wave mitigator is configured to mitigate the impact of the surface waves on a main lobe of an elevation radiation pattern of the MIMO radar antenna.

Functions, operations, components and/or features described herein with reference to one or more embodiments, may be combined with, or may be utilized in combination with, one or more other functions, operations, components and/or features described herein with reference to one or more other embodiments, or vice versa.

While certain features have been illustrated and described herein, many modifications, substitutions, changes, and equivalents may occur to those skilled in the art. It is, therefore, to be understood that the appended claims are intended to cover all such modifications and changes as fall within the true spirit of the disclosure.

What is claimed is:

1. An apparatus comprising:
   a Printed Circuit Board (PCB);
   a Multiple-Input-Multiple-Output (MIMO) radar antenna on the PCB, the MIMO radar antenna comprising a plurality of Transmit (Tx) antenna elements configured to transmit Tx radar signals, and a plurality of receive (Rx) antenna elements configured to receive Rx radar signals based on the Tx radar signals; and
   a surface wave mitigator connected to the PCB, the surface wave mitigator configured to mitigate an impact of surface waves via the PCB on a radiation pattern of the MIMO radar antenna wherein the surface wave mitigator comprises a carbon-loaded plastic layer on the PCB.

2. The apparatus of claim 1, wherein the carbon-loaded plastic layer comprises carbon-fiber-loaded plastic.

3. The apparatus of claim 1, wherein the carbon-loaded plastic layer is configured as a spacer between the PCB and a radome over the MIMO radar antenna.

4. The apparatus of claim 1, wherein a volume resistivity of the carbon-loaded plastic layer is between 2 Ohm-centimeter (Ohm*cm) and 40 Ohm*cm.

5. The apparatus of claim 1, wherein a volume resistivity of the carbon-loaded plastic layer is between 5 Ohm-centimeter (Ohm*cm) and 35 Ohm*cm.

6. The apparatus of claim 1, wherein a volume resistivity of the carbon-loaded plastic layer is between 9 Ohm-centimeter (Ohm*cm) and 11 Ohm*cm.

7. An apparatus comprising:
   a Printed Circuit Board (PCB);
   a Multiple-Input-Multiple-Output (MIMO) radar antenna on the PCB, the MIMO radar antenna comprising a plurality of Transmit (Tx) antenna elements configured to transmit Tx radar signals, and a plurality of receive (Rx) antenna elements configured to receive Rx radar signals based on the Tx radar signals; and
   a surface wave mitigator connected to the PCB, the surface wave mitigator configured to mitigate an impact of surface waves via the PCB on a radiation pattern of the MIMO radar antenna, wherein the surface wave mitigator comprises a plurality of grounded dummy antenna elements surrounding the plurality of Tx and Rx antenna elements, and a plurality of via fences surrounding the plurality of dummy antenna elements.

8. The apparatus of claim 7, wherein the plurality of via fences comprises at least a first via fence and a second via fence, the first via fence surrounding the plurality of Tx and Rx antenna elements, the second via fence surrounding the first via fence.

9. The apparatus of claim 8, wherein a distance between the first via fence and the second via fence is based on a wavelength of the radiation pattern of the MIMO radar antenna.

10. The apparatus of claim 8, wherein a distance between the first via fence and the second via fence is based on half of a guided wavelength in a dielectric layer of the PCB.

11. The apparatus of claim 1, wherein the surface wave mitigator comprises a patterned resistor-loaded resonant structure on a dielectric layer of the PCB.

12. The apparatus of claim 11, wherein the patterned resistor-loaded resonant structure comprises a plurality of resonant structures, and a plurality of resistors connecting between the plurality of resonant structures.

13. The apparatus of claim 12, wherein the patterned resistor-loaded resonant structure comprises a first plurality of resistors connecting between a first resonant structure of the plurality of resonant structures and a second resonant structure of the plurality of resonant structures, and a second plurality of resistors connecting between the first resonant structure and a third resonant structure of the plurality of resonant structures.

14. The apparatus of claim 13, wherein a distance between a resistor of the first plurality of resistors and a resistor of the second plurality of resistors is between 0.5 millimeter (mm) and 0.9 mm.

15. The apparatus of claim 12, wherein a resonant structure of the plurality of resonant structures comprises a plurality of resonant cells, a resonant cell of the plurality of resonant cells is connected by a resistor of the plurality of resistors to a resonant cell of an adjacent resonant structure.

16. The apparatus of claim 15, wherein the plurality of resonant cells of the resonant structure comprises a first resonant cell and a second resonant cell adjacent to the first resonant cell, the first resonant cell connected by a first resistor to a first resonant cell of the adjacent resonant structure, the second resonant cell connected by a second resistor to a second resonant cell of the adjacent resonant structure.

17. The apparatus of claim 12, wherein a resistance of a resistor of the plurality of resistors is between 100 Ohm per square and 377 Ohm per square.

18. The apparatus of claim 1, wherein the surface wave mitigator is configured to mitigate the impact of the surface waves on a main lobe of the radiation pattern of the MIMO radar antenna.

19. A radar device comprising:
a Printed Circuit Board (PCB);
a Multiple-Input-Multiple-Output (MIMO) radar antenna on the PCB, the MIMO radar antenna comprising a plurality of Transmit (Tx) antenna elements configured to transmit Tx radar signals, and a plurality of receive (Rx) antenna elements configured to receive Rx radar signals based on the Tx radar signals;
a surface wave mitigator connected to the PCB, the surface wave mitigator configured to mitigate an impact of surface waves via the PCB on a radiation pattern of the MIMO radar antenna, wherein the surface wave mitigator comprises a carbon-loaded plastic layer on the PCB; and
a radar processor configured to detect one or more targets based on the Rx radar signals.

20. The radar device of claim 19, wherein the surface wave mitigator comprises a plurality of grounded dummy antenna elements surrounding the plurality of Tx and Rx antenna elements, and a plurality of via fences surrounding the plurality of dummy antenna elements.

21. A vehicle comprising:
a system controller configured to control one or more vehicular systems of the vehicle based on radar information; and
a radar device configured to provide the radar information to the system controller, the radar device comprising:
a Printed Circuit Board (PCB);
a Multiple-Input-Multiple-Output (MIMO) radar antenna on the PCB, the MIMO radar antenna comprising a plurality of Transmit (Tx) antenna elements configured to transmit Tx radar signals, and a plurality of receive (Rx) antenna elements configured to receive Rx radar signals based on the Tx radar signals;
a surface wave mitigator connected to the PCB, the surface wave mitigator configured to mitigate an impact of surface waves via the PCB on a radiation pattern of the MIMO radar antenna, wherein the surface wave mitigator comprises a carbon-loaded plastic layer on the PCB; and
a radar processor configured to provide the radar information based on the Rx radar signals.

22. The vehicle of claim 21, wherein the surface wave mitigator comprises a plurality of grounded dummy antenna elements surrounding the plurality of Tx and Rx antenna elements, and a plurality of via fences surrounding the plurality of dummy antenna elements.

23. The vehicle of claim 21, wherein the carbon-loaded plastic layer is configured as a spacer between the PCB and a radome over the MIMO radar antenna.

24. The vehicle of claim 21, wherein a volume resistivity of the carbon-loaded plastic layer is between 2 Ohm-centimeter (Ohm*cm) and 40 Ohm*cm.

* * * * *

UNITED STATES PATENT AND TRADEMARK OFFICE
CERTIFICATE OF CORRECTION

PATENT NO. : 11,598,842 B2
APPLICATION NO. : 16/831924
DATED : March 7, 2023
INVENTOR(S) : Arnaud Amadjikpe et al.

It is certified that error appears in the above-identified patent and that said Letters Patent is hereby corrected as shown below:

In the Claims

In Column 26, Line 6, in Claim 1, delete "pattern of the MIMO radar antenna wherein the surface" and insert -- pattern of the MIMO radar antenna, wherein the surface --, therefor Signed and Sealed this
Twenty-fifth Day of April, 2023

Katherine Kelly Vidal
*Director of the United States Patent and Trademark Office*